(12) United States Patent
Chang et al.

(10) Patent No.: US 6,316,966 B1
(45) Date of Patent: Nov. 13, 2001

(54) APPARATUS AND METHOD FOR SERVO-CONTROLLED SELF-CENTERING PHASE DETECTOR

(75) Inventors: Charles Chang, Thousand Oaks; Bo Zhang, Las Flores; Zhihao Lao, Thousand Oaks; Steven Beccue, Oxnard; Anders K. Petersen, Carpinteria, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/615,631

(22) Filed: Jul. 13, 2000

Related U.S. Application Data

(60) Provisional application No. 60/144,432, filed on Jul. 16, 1999.

(51) Int. Cl.[7] ............................................. H03D 3/00
(52) U.S. Cl. ............................................. 327/2; 327/12
(58) Field of Search .......................... 327/2, 3, 5, 7, 327/8, 9, 12; 375/226, 360, 373, 375; 331/1 R, 25

(56) References Cited

U.S. PATENT DOCUMENTS

| | | | |
|---|---|---|---|
| 4,218,771 | 8/1980 | Hogge, Jr. ............................ | 375/120 |
| 4,422,176 | 12/1983 | Summers ............................. | 375/120 |

(List continued on next page.)

FOREIGN PATENT DOCUMENTS

| | | |
|---|---|---|
| 2 331 416 | 8/1998 | (GB) . |
| WO 00/31914 | 6/2000 | (WO) . |

OTHER PUBLICATIONS

B. Razavi and J. Sung, "A 6 GHz 60 mW BiCMOS Phase–Locked Loop", pp. 320–325, reprinted from IEEE J. Solid–State Circ., vol. SC–29, pp. 1560–1565, Dec. 1994.
J.D.H. Alexander, "Clock Recovery From Random Binary Signals", pp. 242–243, reprinted from Electronics Letters, vol. 11, pp. 541–542, Oct. 1975.

(List continued on next page.)

*Primary Examiner*—Kenneth B. Wells
*Assistant Examiner*—Linh Nguyen
(74) *Attorney, Agent, or Firm*—Foley & Lardner

(57) ABSTRACT

Modern fiber optic networks typically transfer data using encoding in which the clock is transmitted along with the data, for example in NRZ format. In order to use the clock to process the data, the clock signal must be extracted from the data signal. Because the data and clock may travel through different circuit paths they may have different propagation delays and a phase offset between the clock and data may result. Data and clock phase offsets are more problematical as data transmission speed increases. Furthermore the data/phase offset is typically not constant and may change with a variety of variables. To compensate for the changing offset, one or more variable delays are inserted in the phase detector circuitry. The timing of the variable delay is controlled by a bang-bang phase detector, such as an Alexander phase detector, which determines if the clock is leading, lagging, or in phase with the data. The delay control loops are low bandwidth, because the phase offset generally changes slowly, and because the loops should not respond to temporary upsets such as noise spikes. The delay control loops integrate the output of the bang-bang phase detector and use the output to control a decimated up down counter, which is then further used to control one or more variable delays. The counter can be pre-loaded with a default start point, and the bandwidth of the loops can be dynamically adjusted by changing the decimation ratio and sample periods of the loop.

4 Claims, 21 Drawing Sheets

U.S. PATENT DOCUMENTS

| | | | |
|---|---|---|---|
| 4,724,401 | | 2/1988 | Hogge, Jr. et al. ........................ 331/4 |
| 4,881,243 | | 11/1989 | Whitt ........................................ 375/4 |
| 5,115,208 | * | 5/1992 | Masdea et al. ......................... 327/12 |
| 5,530,382 | * | 6/1996 | Kojima ..................................... 327/7 |
| 5,592,125 | * | 1/1997 | Williams ................................. 327/12 |
| 5,799,048 | | 8/1998 | Farjad-Rad et al. .................. 375/360 |
| 6,151,356 | * | 11/2000 | Spagnoletti et al. .................. 327/226 |

OTHER PUBLICATIONS

T. Lee and J. Bulzacchelli, "A 155–MHz Clock Recovery Delay and Phase–Locked Loop", pp. 421–430, reprinted from IEEE J. Solid–State Circuits, vol. 27, pp. 1736–1746, Dec. 1992.

B. Razavi, "Monolithic Phase–Locked Loops and Clock Recovery Circuits",. Piscataway, NJ: IEEE Press, 1996.

* cited by examiner

| Decimation ratio (M) | Clock rate | Equivalent bandwidth (50% transition) |
|---|---|---|
| 1024 | fs/1024 | 4.7kHz |
| 512 | fs/512 | 9.4kHz |
| 256 | fs/256 | 18.8kHz |
| 128 | fs/128 | 37.6kHz |
| 64 | fs/64 | 75.2kHz |
| 32 | fs/32 | 150.4kHz |
| 16 | fs/16 | 300.8kHz |
| 8 | fs/8 | 601.6kHz |

Figure 14

APPARATUS AND METHOD FOR SERVO-CONTROLLED SELF-CENTERING PHASE DETECTOR

CROSS-REFERENCE TO RELATED APPLICATIONS

Embodiments of the present invention relate to U.S. Provisional Application Ser. No. 60/144,432, filed Jul. 16, 1999, entitled "Servo Controlled Self-Centering Low-Power Phase Detector. The contents of said provisional application are incorporated by reference herein.

FIELD OF THE INVENTION

The present invention relates, generally, to apparatus and methods of phase detection, and, in particular embodiments to methods and apparatus for high speed phase detection and clock regeneration in which variable circuit delays are inserted into phase detector circuitry and controlled by feedback loops in order to adjust signal propagation times.

BACKGROUND OF THE INVENTION

As the demand for data bandwidth increases, so does the demand for high bandwidth optical data transmission techniques.

Typically, there are two basic ways that digital data is formatted in fiber optic systems. The two formats are the return-to-zero (RZ) format and the non-return-to-zero (NRZ) format. In the NRZ format, each bit of data occupies a separate timeslot and is either a binary 1 or a binary 0 during that time period. In contrast, in the RZ format, a time period is allowed for each bit. Each bit is transmitted as a pulse or an absence of a pulse. Both formats are referenced to a system clock. The system clock, however, is not a separate signal and must be recovered from the data. A clock signal may be recorded, for instance from NRZ data, by using the transition occurrences within the data transmitted. The process of recovering a clock signal from transmittal data is typically referred to as clock data recovery (CDR). Clock data recovery subsystems are a key block for digital communications and telecommunication circuits. CDR systems are also used in a variety of other digital systems, for example disk drives.

Commonly clock data recovery circuits are based on the use of phase lock loops (PLL). Unlike phase lock loops that are used in wireless applications, a CDR PLL operates on random data, such as but not limited to non-return-to-zero data, instead of a sine wave or modulated sine wave signal. With NRZ data, the clock signal, which is encoded with the data, must be regenerated from the data since the data must eventually be processed synchronously. A further complication with clock and data recovery circuits is that the data spectrum is broadband. This is in contrast to the narrow band spectrum PLLs, which are commonly encountered in typical PLL applications such as synthesizers, demodulators, and modulators.

In CDR circuits, a regenerated clock signal is typically used to retime the data through a Flip-Flop, which is used as a decision circuit. This retiming of data comprises the data recovery function of the CDR circuit. By retiming the data, the data stream is essentially recreated and time domain jitter, which may be present in the NRZ signal or produced by the NRZ receiver circuitry, may be greatly reduced.

A typical application using clock and data recovery circuits is a SONET (synchronous optical network) system. In SONET systems, the CDR subsystem has difficult performance specifications to meet in terms of jitter tolerance, jitter generation, jitter transfer, bit error rate, and phase margin. These performance specifications are held within tight tolerances so that SONET systems may deliver high quality data with a low BER (bit error rate).

A key parameter affecting the quality of data received is the phase margin. Phase margin is the phase relationship between data and clock that results in correct data being reproduced. In other words, if the phase margin of a decision circuit that is decoding the transmitted data needed is exceeded, the probability that errors can result may increase. In order to minimum phase margin error, the clock should cause the data to be sampled at times when the data is stable, that is, at a time when the data is not in transition. Such sampling requires that the sampling edge of the clock signal reside at or near the middle of the transmitted data bit. This condition, in which the clock resides in the middle of the data bit, is referred to as centered clock/data. To achieve the condition of centered clock/data the phase lock loop within the clock and data recovery circuit must maintain a particular static phase offset between the clock and data. This static phase offset requirement is typically more stringent than the lock requirement in standard PLL applications. In addition, because the clock regeneration is using a data stream to regenerate the clock, the performance of the phase detector will be dependent on the data patterns within the data transmitted.

Commonly Hogge type phase detectors are used in clock data recovery circuits. Process, temperature, voltage, data pattern, transition density, and matching circuit delay variations affect the performance of Hogge type phase detectors. Such variations, which are difficult to compensate, result in a combination of increased static phase error, reduced phase margin, and high pattern dependant jitter. In high-speed designs, the effect of such variations is exacerbated. Accordingly, design issues become more critical for proper circuit operation as data rate increases.

SUMMARY OF THE DISCLOSURE

Accordingly, to overcome limitations in the prior art described above, and to overcome other limitations that will become apparent upon reading the present specification, preferred embodiments of the present invention relate to apparatus and method for assuring proper phase margin, in order to achieve high rates of reliable data reproduction.

A preferred embodiment of the present system comprises the integration of Hogge and Alexander type phase detectors.

In particular, preferred embodiments of the present system provide a linear type phase detector, exemplary a Hogge type phase detector. The linear phase detector has matching delays inserted within the circuitry within the data and/or clock paths to compensate for mismatch in the different propagation speeds of data and clock signals through the circuitry.

Signal propagation through circuitry changes with a variety of variables such as the process used to fabricate the circuit, actual fabrication parameters, temperature, voltage, input signal level and even the data pattern received. Because a variety of variables affect propagation delays, it is very difficult to match propagation delays statically through clock and data circuits. It is important to match clock and data propagation times through circuitry because the maximum data frequency can be achieved if the transition times for the data and clock are matched. In order to match the propagation delays of the data and clock signals through circuitry variable circuit delays are placed in the clock and/or data path. The phase mismatch between the data and clock is measured locally using a digital phase detector also known as a "bang-bang" phase detector. Once the phase difference between the clock and data is determined, a delay upstream of the clock and/or data signal can be controlled in order to match propagation delays and hence the phase of the data and clock signals.

Because the factors affecting propagation delay within a circuit change slowly, the control loops used to control the propagation delays within the circuitry must be low bandwidth. Additionally the control loop bandwidth should be low so that control loops for the inserted circuit delays not react to transitory upsets in data or clock signals. The local matching control loop should be significantly slower than the overall phase detector loop. In practice, slowing the local control loop is problematical. The traditional method of slowing the response of a control loop, such as an AFC loop, is to add an integrator with a large time constant. Such large time constants are traditionally accomplished by inserting a RC (Resistor-Capacitor) network with a large time constant. Such a large time constant can be fabricated by adding external resistors or capacitors to the phase detector circuitry, which is contained in an integrated circuit. Adding such external components not only adds to the cost of the circuitry, but also consumes precious input/output pins upon the integrated circuit containing the loop.

In one embodiment of the present invention, a method, which may accomplish the same purpose as the large time constant RC network and yet be entirely fabricated efficiently on an integrated circuit, is used to produce the low frequency control circuitry for the delays. In this embodiment, the high speed up and down outputs of a bang-bang type phase detector, such as an Alexander phase detector, are coupled into opposite sides of a chip capacitor. The capacitor integrates the high frequency pulses from the bang-bang phase detector such that the analog voltage across the capacitor is proportional to the average difference in the number of up and down pulses produced by the bang-bang phase detector. If the voltage across the capacitor is zero volts, then an equal number of up and down pulses have been produced. A zero voltage across the capacitor means that the clock and data are essentially in proper phase. If a greater number, on average, of up pulses then down pulses have been produced, voltage across the capacitor will be positive. If, however, on the average, a greater number of down pulses than up pulses have been produced, the voltage across the capacitor will be negative. A positive voltage across the capacitor indicates that the phase of the data is leaving the clock. A negative voltage across the capacitor indicates that the data is lagging the clock. The voltage across the capacitor is then coupled into a comparator or a one-bit digital-to-analog converter. The one-bit digital-to-analog converter will have an output of zero if the voltage across the capacitor is positive and will have an output of one if the voltage across the capacitor is negative. The output of the digital-to-analog converter is then coupled into an up/down counter. An up/down counter is coupled to a clock signal and if the output of the digital-to-analog converter is zero volts, the counter will count up. If the output of the digital-to-analog converter is one volt, the up/down counter will count down. The output of the up/down counter can then be decimated in a variety of ways. The up/down counter may couple into a divide-by circuit, it may be sampled at long intervals or the least significant bits can be merely dropped. The decimated output of the counter can then be used to control the circuit delay thereby closing the control loop.

The response of the control loop can be controlled by several different factors. First, by slowing the clock of the up/down counter, the rate of counting can be slowed. Second, by dividing the output of the up/down counter the response of the loop can also be controlled. Because the response time of the loop controlling the local circuit delays is easily controlled, the loops can be adjusted for varying circuit conditions. For example, a faster loop can be used on startup to speed lock acquisition. Inversely, the loop can be slowed in very noisy environments in order to prevent it from reacting to noise.

Further embodiments of the invention may employ multiple variations in order to achieve different results. For example, multiple loops can be employed to match clock and data phases at various points within the circuitry. Matching individual delays, instead of matching an overall delay may achieve a finer control of the data and clock phases within the circuitry, thereby allowing the maximum speed at which the circuitry can operate to increase.

In other embodiments, other aspects of the present invention can be utilized. For example, the counter coupled to the output of the one-bit digital-to-analog converter can be preloaded to a default value upon startup of the circuitry. Such a value can be predetermined and recorded within the integrated circuit or the value maybe obtained by recording the value of the counter during a steady state operating condition. Then on startup the steady state values may be loaded into the counter thereby providing a close approximation to the ideal value. Such preloading on startup can speed the acquisition of lock of the overall system. The counter value may also be recorded and averaged so that upon loss of signal the loop can be restarted with a value close to the previous steady state value.

Other embodiments of the present invention can be used to tailor the response speed of delay elements to the transition density of incoming data. Phase detectors, such as Hogge phase detectors, have a phase detector gain that is proportional to the transition density of the incoming data. For example, the overall gain of a Hogge phase detector detecting a 11001100 pattern is generally only half as fast as the same Hogge phase detector detecting a 10101010 pattern. The individual phase delays within the circuitry should be controlled with a frequency response that is lower than the bandwidth of the overall data loop. By observing the transition density of the data, and hence the gain of the primary loop, the frequency response of the delay control loops can be made to be less than that of the primary loop. The frequency response of the delay control loop(s) may be controlled dynamically, to be less than the frequency response of the overall phase detector loop, even as the response of the overall control loop is changing due to changes within incoming data pattern.

BRIEF DESCRIPTION OF THE DRAWINGS

Referring now drawings in which consistent numbers refer to like elements throughout.

FIG. 14 is a chart relating decimation ratio and clock rate to bandwidth equivalent for variable delay control loops according to embodiments of the invention.

DETAILED DESCRIPTION OF PREFERRED EMBODIMENTS

In the following description, reference is made to the accompanying drawings, which form a part hereof, and in which is shown by way of illustration specific embodiments in which the invention may be practiced. It is to be understood that other embodiments may be utilized as structural changes may be made without departing from the scope and inventive concepts of the present disclosure.

Accordingly, embodiments of the present invention relate, generally, to phase detectors. However, for the purposes of simplifying this disclosure, preferred embodiments are described herein with relation to Sonnet clock data recovery circuits, which employ phase detectors. This exemplary embodiment is chosen as an example likely to be familiar to those skilled in the art, but is not intended to limit the invention to the example embodiment. The examples disclosed are intended to illustrate the inventive aspects of the present invention, which are applicable to a variety of electronic systems.

Figure 1:
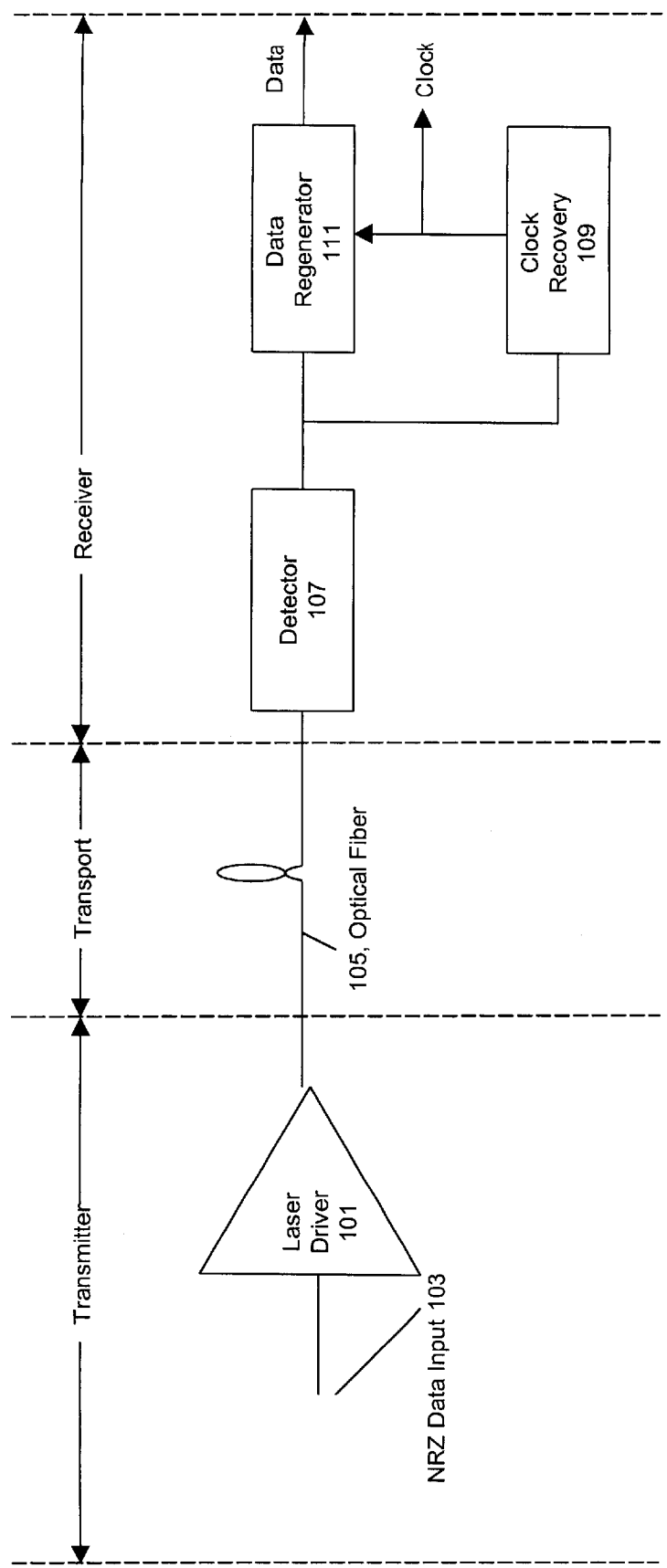
FIG. 1 is a block diagram of an environment in which the invention may be practiced.

FIG. 1 is a block diagram of an environment illustrating according to an example embodiment of the present invention.

FIG. 1 illustrates a block diagram a SONET system. The term SONET is an acronym derived from synchronous optical network. SONET is a standard for optical telecommunications data transport formulated by the Exchange Character Standards Association (ECSA) for the American National Standards Institute (ANSI). ANSI is a standards group, which sets industry standards in the United Standards for the telecommunications industry. A portion of the SONET network is illustrated in FIG. 1. The transmitter section of the SONET network commonly comprises a laser driver unit 101 into which NRZ data is input 103. The laser driver accepts the NRZ data and produces laser light pulses, which are then applied to a transport media, typically a fiber optic cable 105. The laser signal is then received in a detector 107 where it is converted back into an electrical signal representing NRZ data. The NRZ data signal from the detector is then coupled into a clock recovery circuit 109. A clock recovery circuit is commonly employed because a clock signal is encoded along with the NRZ data and not transmitted separately. The clock is then coupled into a data regenerator 111 that accepts the NRZ signal from the detector 107 as well as the regenerated clock signal, and reproduces the data. The regenerated clock signal is recovered from the clock recovery circuit 109. The clock recovery circuit 109 synchronizes the regenerated clock with the NRZ signal from detector 107. A phase detector (PD) is the heart of the clock recovery circuit 109.

Figure 2:
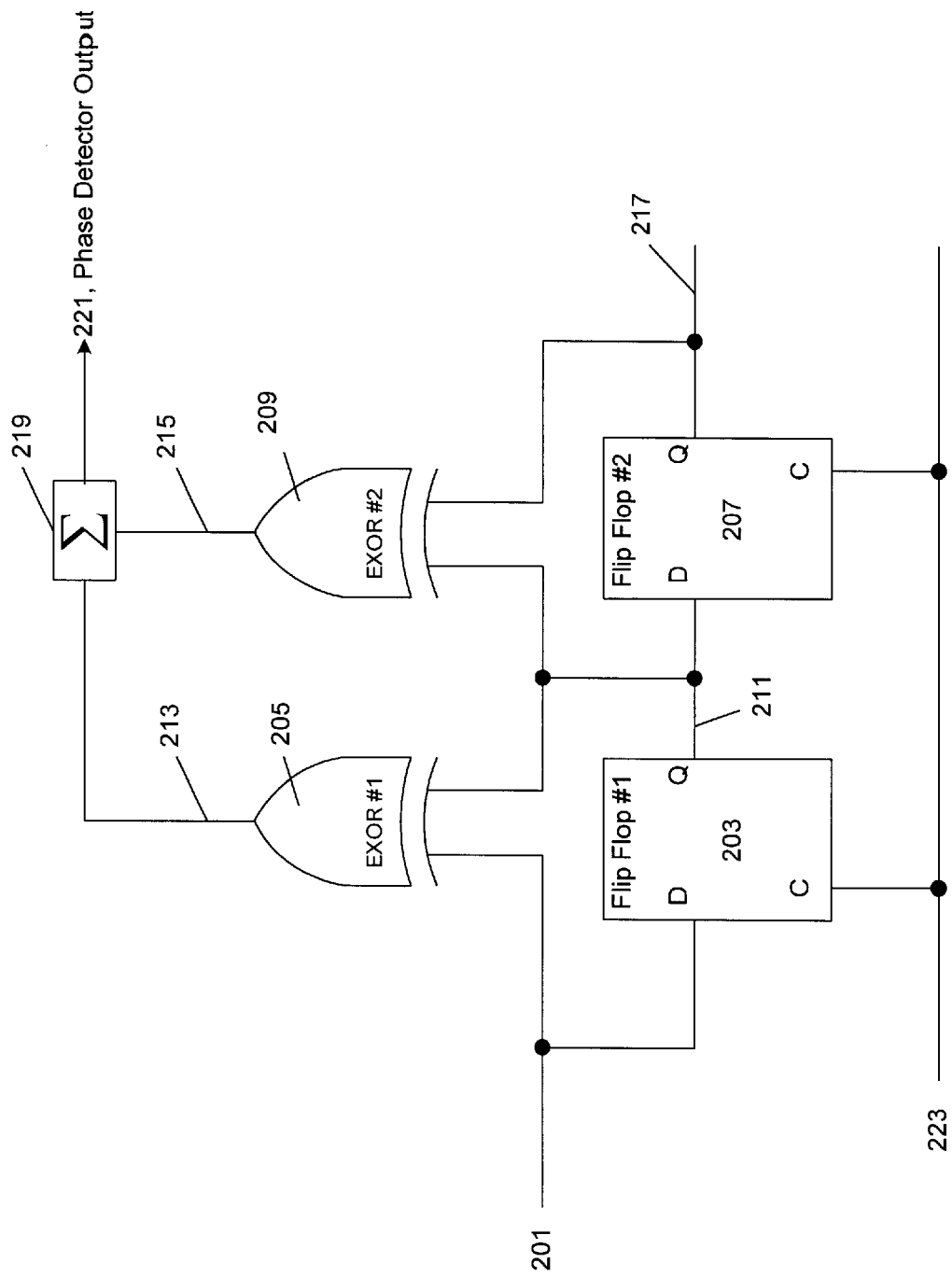
FIG. 2 is a schematic of a Hogge-type phase detector.

FIG. 2 is an illustration of a Hogge type phase detector. A complete description of a Hogge type phase detector may be found in the paper entitled "A Self-Correcting Clock Recovery Circuit" by Charles R. Hogge Jr., Member IEEE, which may be found in the *IEEE Journal of Light Wave Technology*, Volume LT-3, pages 312–314, December 1985, which is incorporated by reference herein. In FIG. 2, NRZ data is coupled to data input conductor 201. A recovered clock signal is coupled to clock conductor 223. The first D-type Flip-Flop 203 is clocked on the rising edge of the clock signal provided on conductor 223 and the second D Flip-Flop 207 is clocked on the falling edge of the clock signal provided on conductor 223. The data does not immediately appear at the Q output of the first Flip-Flop 203, that is Flip-Flop 203 is not transparent. The data presented to Flip-Flop 203 on conductor 201 appears at the Q output, and is thereby coupled into conductor 211 upon the occurrence of a rising edge of a clock signal on 223 plus the delays associated with the set up and hold times of the first Flip-Flop 203. Therefore data, the, that appears on conductor 211 the Q output of D Flip-Flop 203 is re-timed data. After a change in the state of the data input 201, the D input and Q output of D Flip-Flop 203 are no longer equal, which will cause the output of Exclusive OR gate 205 to go high. The output of Exclusive OR 205 will remain high until the next rising edge of the clock 223, when the data input's new state is clocked through Flip-Flop 203. Once the new input has been clocked through Flip-Flop 203, the disparity between the data input 201 and the Q output 211 of Flip-Flop 203 is eliminated. At the same time that the disparity between the D input and of output of Flip-Flop 203 is clocked out Exclusive OR gate 209 raises its output high because the D and Q lines of Flip-Flop 207, which are the inputs to the send Exclusive or 209, are now unequal. The output of Exclusive OR 209 remains high until the next falling edge of the clock at which time the input data's 201 new state is clocked through Flip-Flop 207.

A clock signal typically has a 50% duty cycle. Assuming a 50% duty cycle, the output 213 of Exclusive OR 209 is a positive pulse with a width equal to half the clock period for each data transition. Exclusive OR 205's output is also a positive pulse for each data transmission, but its width depends on the phase error between the input data 201 and the clock. The output pulse width of Exclusive OR 205 equals half a clock period when the delay and the clock are optimally aligned. Accordingly, the phase error between the clock and the data can be obtained by comparing the widths of the output pulses of Exclusive ORs 205 and 209. The output 213 of the first Exclusive OR 205 is coupled into a summation unit 219. The output 215 of the second Exclusive OR 209 is also coupled into summation 219 where it is subtracted from the output signal 213 of Exclusive OR 205. The result of the summation in unit 219 is a phase detector output 221. If the phase of the data leads the clock, the output of the phase detector 221 has a positive average value. Conversely, if the phase of the data lags the clock, the phase detector output 221 would have a negative average value. The average output of the phase detector 221 is equal to 0 when the average phase error between the input data and the clock is 0.

Figure 3:
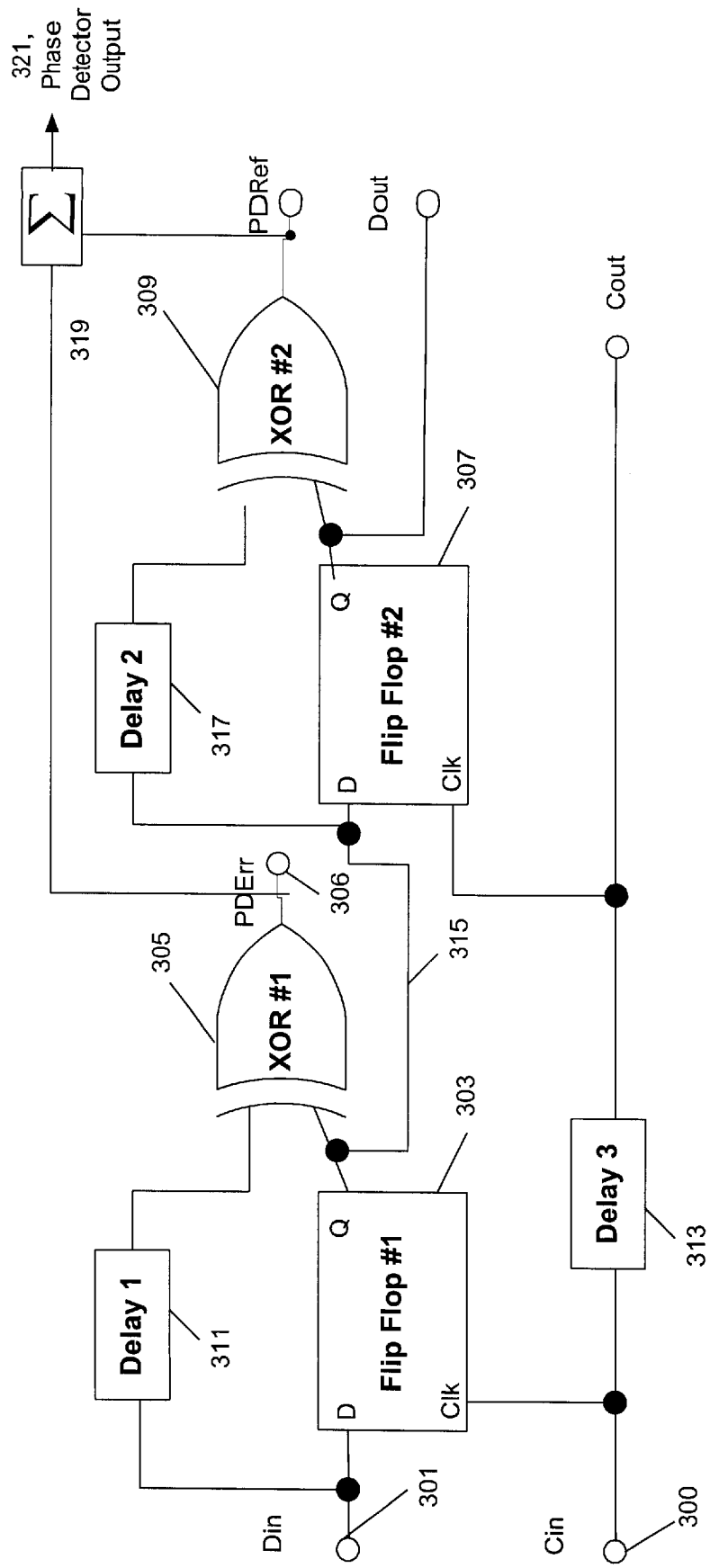
FIG. 3 is a schematic and block diagram of a Hogge-type phase detector in which appropriate delays have been added to facilitate high-speed operation of the circuit.

FIG. 3 is a Hogge phase detector circuit in which appropriate delays have been added to facilitate high speed operation of the circuit. As data and clock speeds increase, circuit delays become more significant. For example, with respect to FIG. 3, the first Hogge Flip-Flop 303 is clocked on the rising edge of the clock signal 300. Any data coupled into Flip-Flop 303 on input conductor 301 will appear a time T1 after the rising edge of the clock. In order to match the delay T1 a Delay 311 is inserted between the data input conductor 301 and Exclusive OR 305. The preferred case is when T1=Delay 1 so that any data change presented to Exclusive OR 305 simultaneously appears on both inputs. The output of Exclusive OR 305 is the difference between the data input (through Delay One, 311) and the previous data which was clocked into Exclusive OR 305 through the first Flip-Flop 303. In other words, the output of Exclusive OR 305 is a square wave of variable width. The width of the square wave output from Exclusive OR 305 depends on the relationship between the clock input on conductor 300 and the data input on conductor 301. In a preferred situation, the first Flip-Flop 303 will be clocked to accept data when the data is at midpoint, that is, when the data is halfway between points at which the data may change. Such a point is commonly known in the art as the center of the "eye pattern" or "eye diagram."

As used herein the "eye pattern" or "eye diagram" refers to the image as seen on an oscilloscope in response to the digital data when the horizontal sweep rate is equal to the baud, bit, or clock rate. Such an oscilloscope display is widely known as an "eye pattern" due to its resemblance to the human eye. Further description of the "eye pattern" may be had by reference to U.S. Pat. No. 3,721,959, which is incorporated by reference herein.

In addition, the output 306 of Exclusive OR 305 is dependant upon the data input bit pattern. For example, if the data input is 1010, the output will be a square wave of frequency that is twice the clock rate. However, if the data input is 11001100, the output 306 of Exclusive OR 305 will be a square wave equal in frequency to the clock input. If the data input is 1111000011110000 the output 306 of Exclusive OR 305 will be one-half the input clock rate. The error signal 306 of the Hogge phase detectors in general exhibits a data dependant gain characteristic. The error signal 306 is a combination of error signal combined with phase information.

The data output of Flip-Flop 303 is coupled into conductor 315. The data coupled to conductor 315 is synchronous data because it has been synchronized to clock input 300 by Flip-Flop 303. Therefore the output 310 of the second Exclusive OR 309 is dependant only on the data pattern. Accordingly, when the output 310 of Exclusive OR 309 is subtracted from the output 306 of Exclusive OR 305, the data dependency disappears and only phase information remains.

Figure 4A:
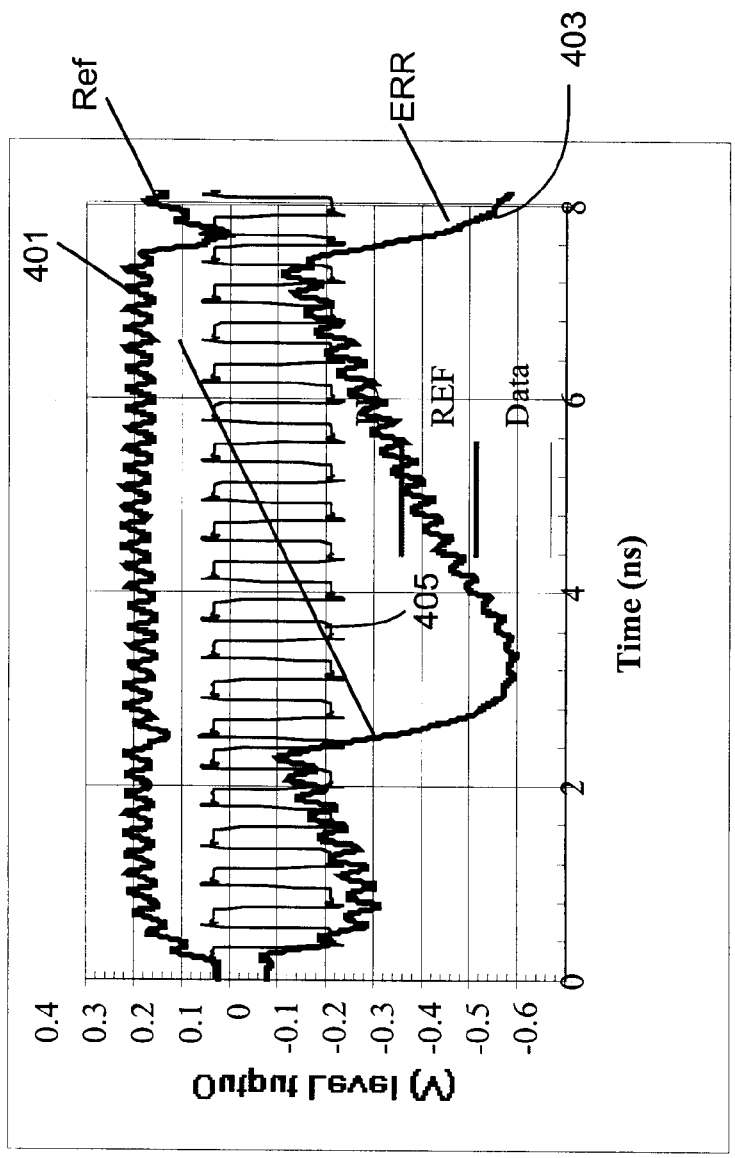
FIG. 4A is a graphical illustration of phase detector performance for the repetitive data pattern 1100.

FIG. 4A is a graphical illustration of phase dependency dependent on data input pattern. FIG. 4A is a graph of a phase detector receiving a 1100 repetitive data pattern in which the phase of the data is swept across a range with respect to the clock. Trace 403 represents the integration of an error signal, for example, an error signal as illustrated in FIG. 3 at 309, the output of Exclusive OR 305. Trace 401 is an integration of a reference signal; for example the reference signal as depicted in FIG. 3 the output 310 of Exclusive OR 309. The resulting summation of the reference trace 401 and the error trace 403 is the phase versus a voltage characteristic of the phase detector.

Figure 4B:
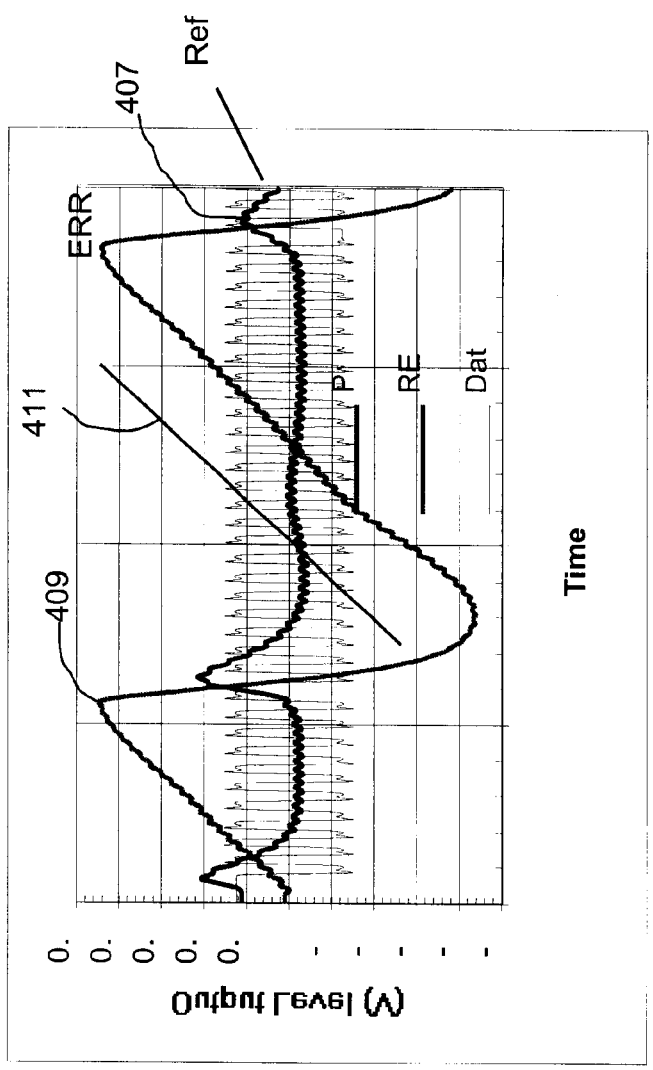
FIG. 4B is a graphical illustration of phase detector performance for the 1010 repetitive data pattern.

In FIG. 4B error signal 409 is plotted against reference signal 407 of the same phase detector as in FIG. 4A except that it is receiving a 1010 data pattern and the phase of the data is being swept across a range with respect to the clock. Once again, by adding the reference signal to the error signal, the voltage versus phase characteristic of the 1010 pattern results. The voltage versus phase curve of FIG. 4B 411 is approximately twice the slope of the voltage versus phase curve, 405, in FIG. 4A. Accordingly, the phase detector gain of a Hogge-type phase detector receiving a 1100 repeating pattern will be one-half of the gain of the same Hogge phase detector receiving a 1010 repeating pattern.

Figure 5A:
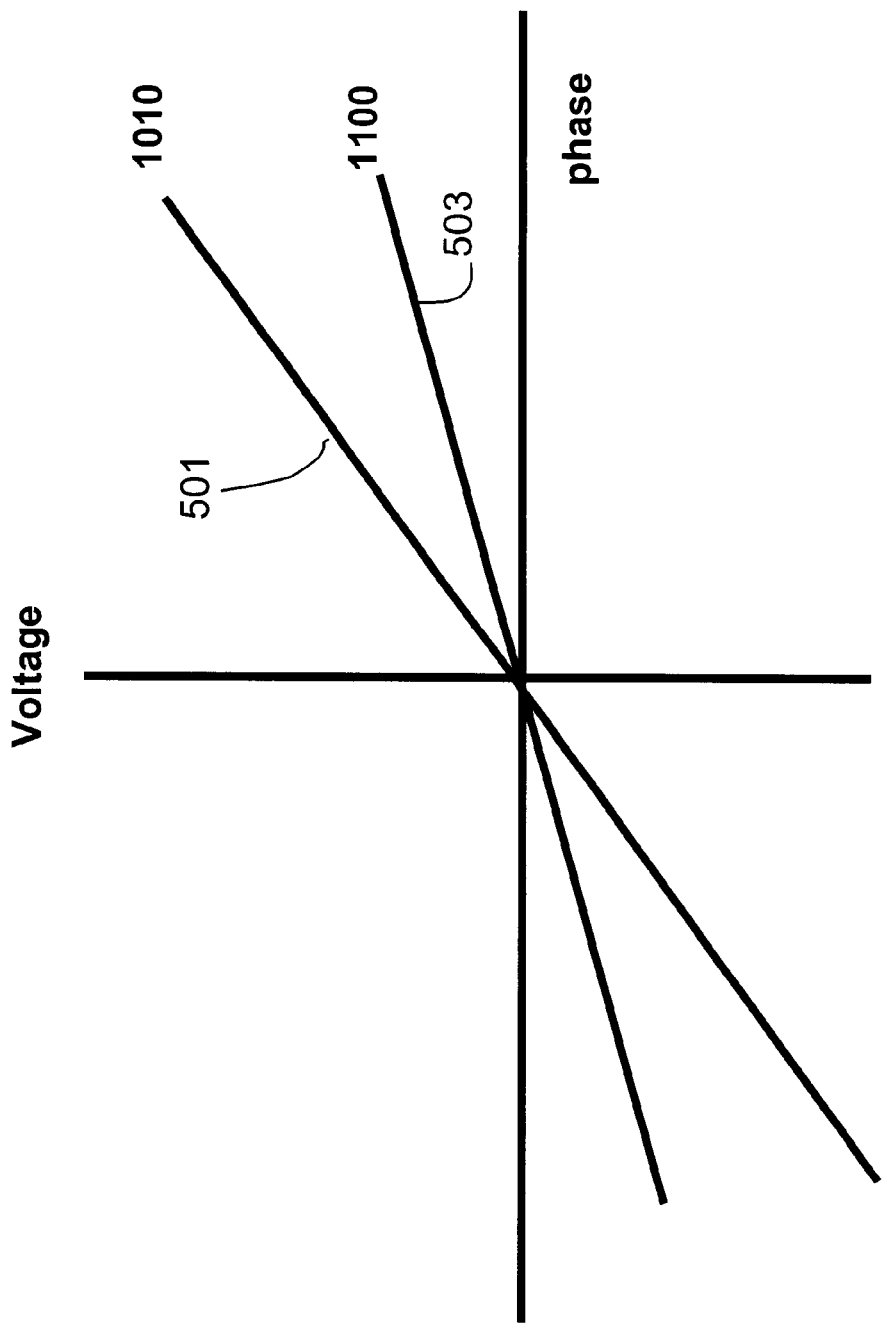
FIG. 5A is a graph of ideal phase detector voltage output versus phase for data patterns 1100 and 1010.

FIG. 5A is an illustrative ideal plot of voltage versus phase for a phase detector circuit such as that illustrated in FIG. 3. Trace 501 represents the data pattern 1010 and trace 503 represents the pattern 1100. As can be seen from FIG. 5A, the slope 501 of the phase detector receiving the repetitive 1010 pattern is twice the slope 503 of the phase detector receiving the 1100. Additionally, both curves go through the origin of the voltage phase detector graph indicating that at zero volts there is zero phase error, i.e., there is no offset.

Figure 5B:
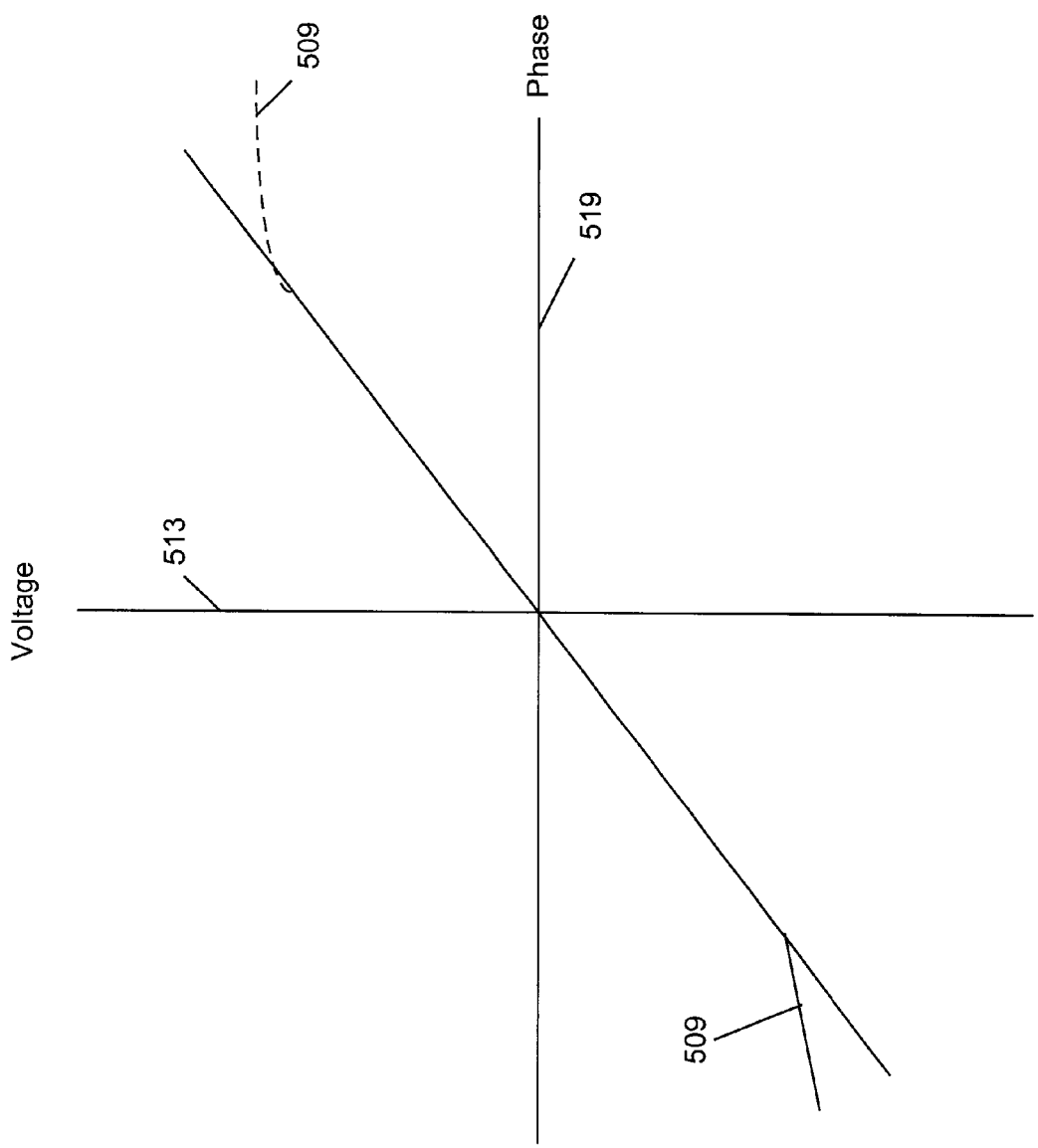
FIG. 5B is a graph of ideal phase detector output voltage versus phase upon which an actual phase detector output voltage versus phase trace has been superimposed for comparison.

FIG. 5B is a graph of an ideal phase detector with graph of a typical phase detector superimposed on the same graph. In FIG. 5B voltage is plotted on the vertical axis 513 and phase on the horizontal axis 519. The straight line 507 represents an ideal response to a data pattern of 1010. The ideal response is when the voltage versus phase graphs is a straight line as illustrated by trace 507. In actuality the characteristic of the phase detector output tends to decrease towards the end points of the graph as shown by superimposed trace 509. This reduction in gain is due in part due to bandwidth considerations. The problem tends to be exacerbated as the data frequency increases and the roll off, as illustrated by 509, becomes more pronounced.

Figure 5C:
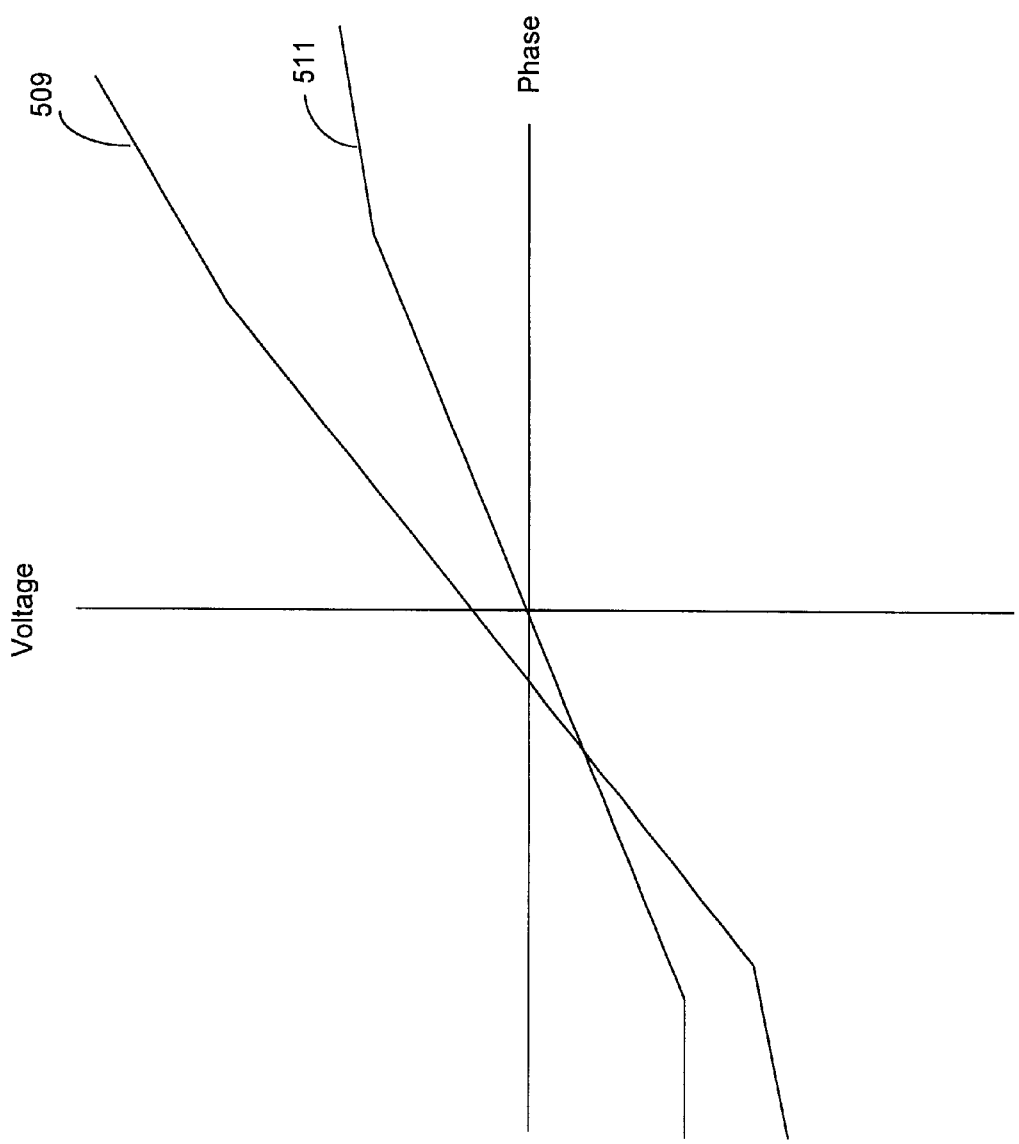
FIG. 5C is a graph illustrating two actual phase detector characteristics for different data patterns.

FIG. 5C is a graph illustrating a phase detector characteristic for two different data patterns. In FIG. 5C data pattern 509 has a higher data transition rate than data pattern 511. The data pattern 511 also does not cross the voltage versus phase graph at the origin. The result is that a phase offset 513 is produced. Curve 509 also does not cross the origin and produces offset 515. Accordingly, the phase detector illustrated in FIG. 5C must traverse a phase, represented by the phase offset between offset 513 and offset 515 when the data pattern switches between the pattern, which produced curve 511 and the pattern, which produced curve 509.

Additionally phase offsets may be due to degradation of data coupled into a phase detector circuit. For example, if the data coupled into a phase detector circuit, e.g. 301, drops in amplitude, the phase delay through the initial Flip-Flop 303 may change. If the data amplitude is low, the input signal may take longer to cause the Flip-Flop to change states, than if it were the maximum amplitude because the regenerative switching circuitry in the Flip Flop will not be driven as hard by a lower amplitude signal, and hence the signal will take longer to regenerate.

Figure 6:
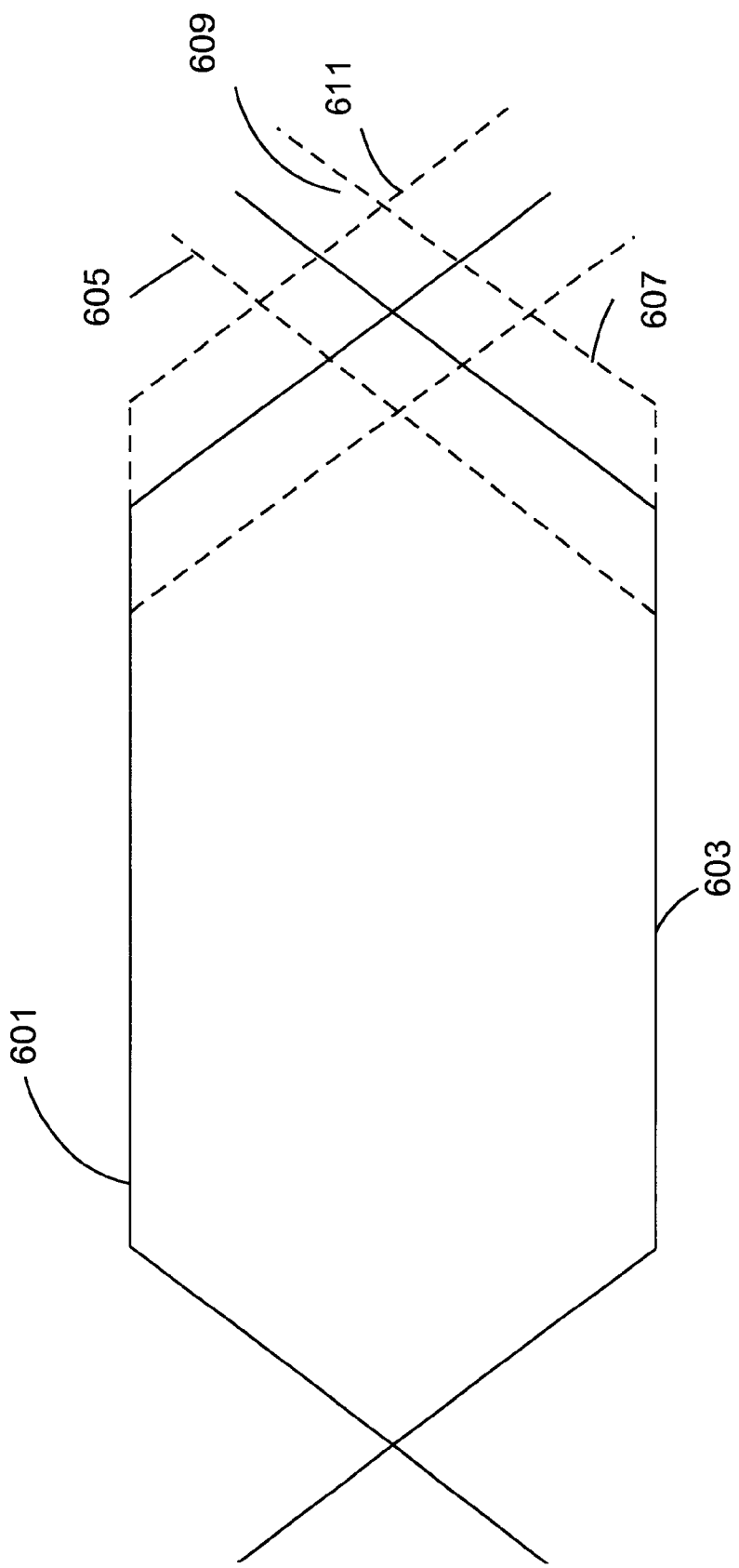
FIG. 6 is an "eye" diagram as may be produced on an oscilloscope by synchronizing a data trace to the data rate.

FIG. 6 is an "eye" diagram produced by synchronizing a data to the data rate trace on an oscilloscope. The ideal "eye" diagram is shown by trace 601 and trace 603. However, if the phase detector circuitry exhibits an offset as shown in FIG. 5C the eye diagram may exhibit jitter such as shown by traces 605 and 607 or 609 and 611 when the data pattern changes. This type of phase jitter is more significant as bit rates increase. By diminishing the effects of phase detector rolloff and phase detector offset the maximum frequency data which can be detected in a Hogge type phase detector can be increased.

In order to maximize the frequency at which a Hogge type phase detector can be operated and minimize the effects of phase offset, circuit delays can be added to the phase detector circuitry to match clock signal propagation times to those in the data path. Such delays are illustrated in FIG. 3 as delay one (311), delay three (313) and delay two (317). Delay 311 is used to match signal delay through Flip-Flop 303. By matching the delay in Flip-Flop 303 to the delay 311, data can be presented to both inputs of the Exclusive OR gate 305 at the same time thereby eliminating phase errors and race conditions which may adversely affect the performance of the phase detector. In other words the first delay 311 can be used to compensate for the data propagation delay through the first Hogge Flip-Flop 303. In a similar manner, the second delay, delay 317, can be used to compensate for signal propagation delay through the second Hogge Flip-Flop, Flip-Flop 307. One of the difficulties in matching the first signal delay 311 to the propagation delay of the first Hogge Flip-Flop 303 (as well as matching the second delay 317 to the signal propagation delay of the second Hogge Flip-Flop 307) is that the input sensitivity of the Flip-Flops may drop as the frequency increases. Additionally propagation delays may vary with temperature in both the delay circuits and the Flip-Flop circuits.

Delay 313 is added to center the clock to-the input data. Delay no. 3 affects the offset of the phase detector curve and may be used to assure that the phase detector voltage versus frequency curve traverses the origin of the phase detector transfer curve (see FIGS. 5A, 5B, 5c), thereby eliminating any static phase offset. Delay 3 may be used to set the curve's zero crossing point correctly.

In order to maximize phase detector performance, the matching delays will need to be adjusted as the propagation delays within the Flip-Flops change. In other words, the inserted circuit delays must be adjusted to compensate for dynamic changes within the phase detector circuitry.

Figure 7A:
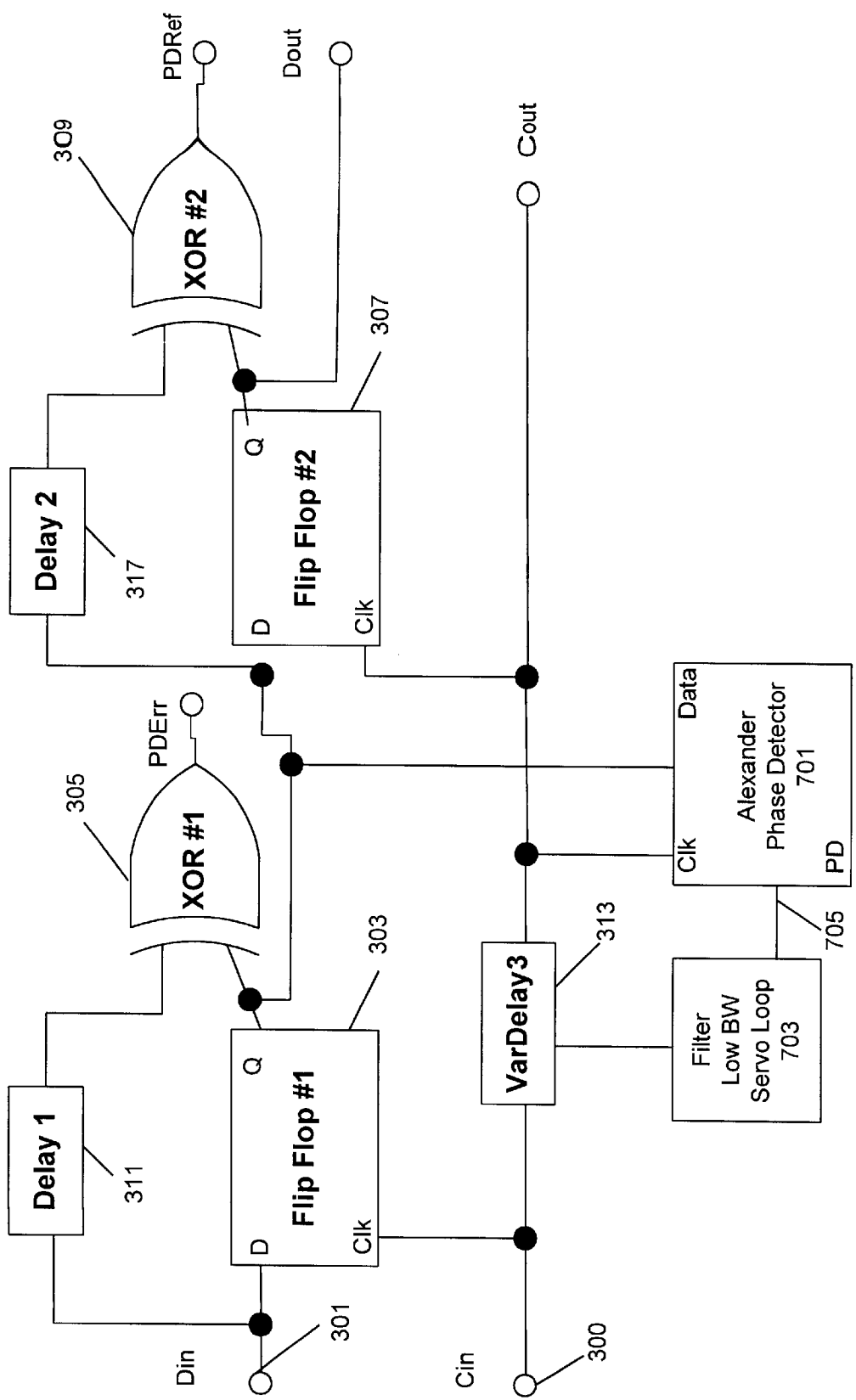
FIG. 7A is a combination block and circuit diagram of a modified Hogge phase detector in which an Alexander type phase detector is used to control the third delay of the modified Hogge phase detector.

FIG. 7A is a combination block and schematic diagram of circuitry used to adjust delay no. 3 of a modified Hogge phase detector. The relationship between the data output of the first Hogge Flip-Flop 303 and the clock, which has been delayed in the third delay, i.e.delay 313, is measured in an Alexander (or bang-bang) phase detector circuit 701. The output 705 of the phase detector circuit 701 is then coupled into a filter 703 and then further used to control the third delay 313.

Figure 7B:
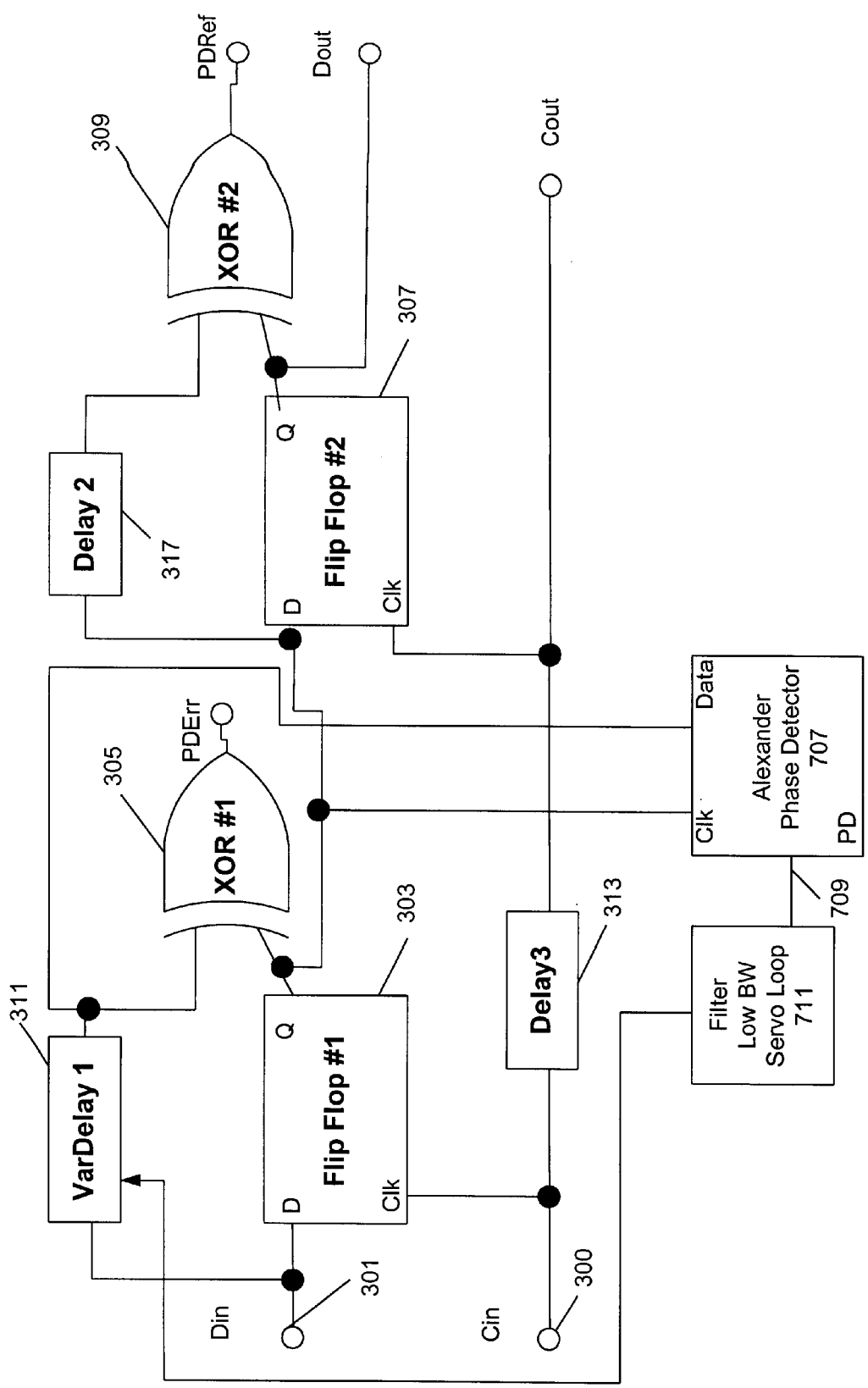
FIG. 7B is a combination block and circuit diagram of a modified Hogge phase detector circuit in which an Alexander type phase detector is used to control the first delay of the modified Hogge phase detector.

FIG. 7B is a combination circuit and block diagram illustrating the use of an Alexander type phase detector to control delay no. 1 of a modified Hogge phase detector circuit. The output of first delay 311 of the modified Hogge phase detector circuit is compared with the output of the first Flip-Flop 303, of the modified Hogge phase detector circuit, in an Alexander (or bang-bang) phase detector 707. The output 709 of the phase detector circuit 707 is coupled into a filter and then further used to control the first delay 311 of the modified Hogge phase detector circuit.

Figure 7C:
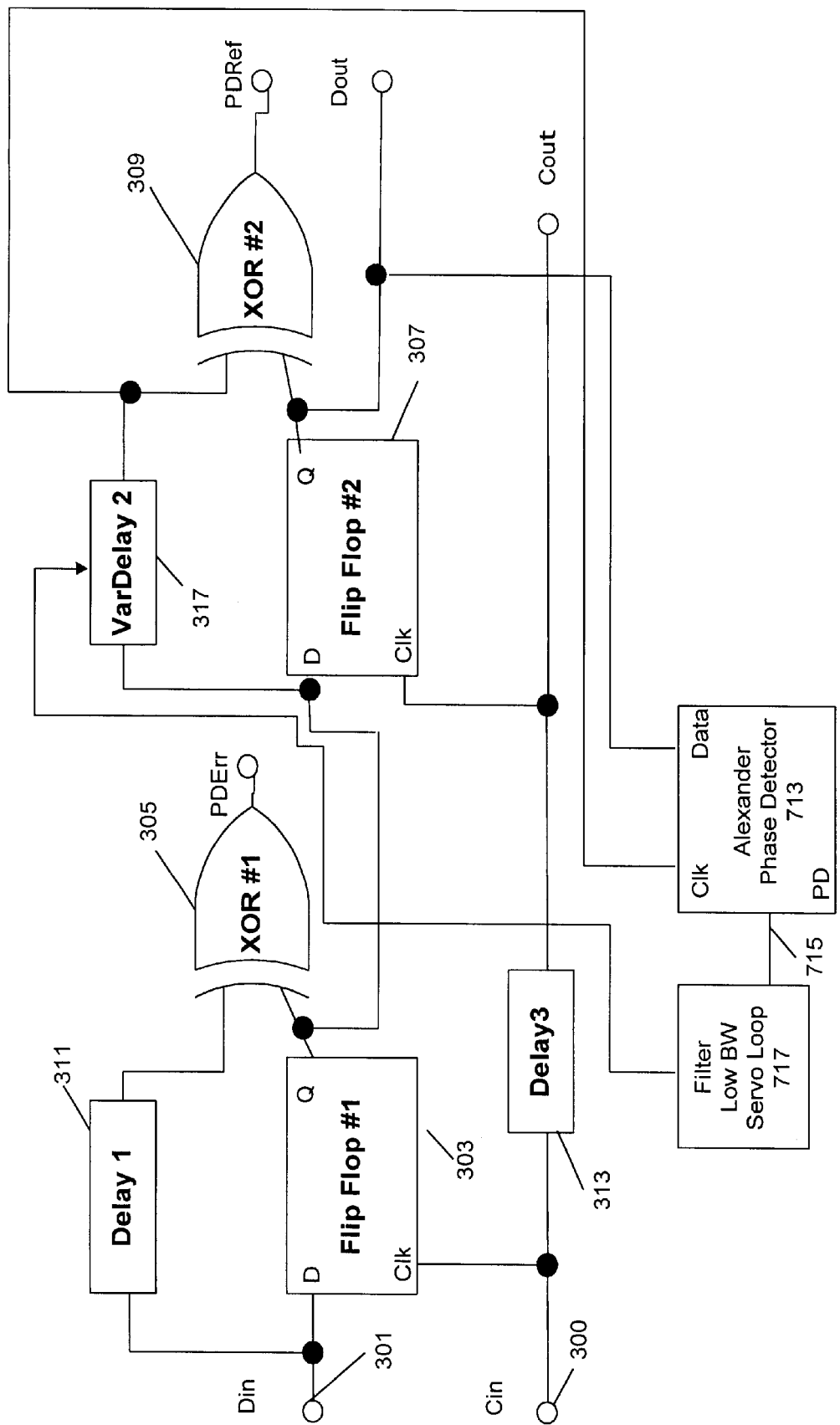
FIG. 7C is a combination block and circuit diagram of a modified Hogge phase detector circuit in which an Alexander type phase detector is used to control the second delay of the modified Hogge phase detector.

FIG. 7C is a combination block and circuit diagram of a modified Hogge phase detector circuit in which an Alexander (or bang-bang) type phase detector is used to control the second delay 317 of the modified Hogge phase detector circuit. The output of the second delay 317, of the modified Hogge phase detector circuit, is compared to the output of the second Flip-Flop 307, of the modified Hogge phase detector circuit using an Alexander type phase detector 713. The output 715 of the phase detector 713 is then coupled into a filter and the filtered output is then used to control the second delay 317, of the modified Hogge phase detector circuit.

Figure 8A:
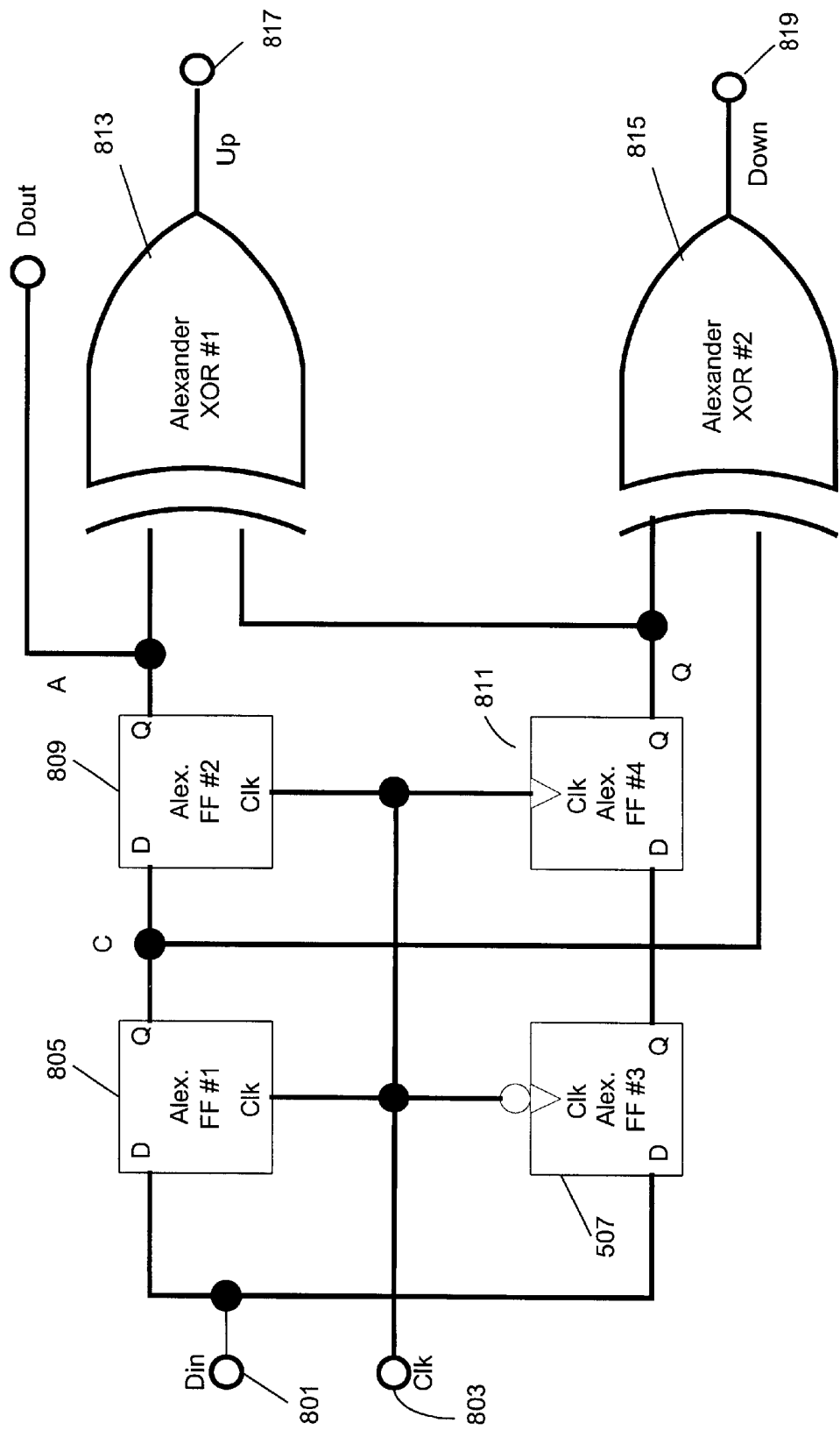
FIG. 8A is a circuit diagram of an exemplary Alexander phase detector as may be used with the delay controlling circuits illustrated in FIG. 7A, 7B or 7C.

FIG. 8 is a circuit diagram of an Alexander (or bang-bang) phase detector as may be used in FIGS. 7A, 7B or 7C. The phase detector is one type of phase detector that may be used in the modified Hogge phase detector circuits of 7A, 7B and 7C. The Alexander (or bang-bang) phase detector is a type of phase detector which does not indicate actual phase, but indicates if one signal is leading, lagging, or in phase with a clocking signal. The Alexander phase detector is named for its inventor, J. D. H. Alexander. The Alexander phase detector is described in *Electronic Letters* by J. D. H. Alexander in an article entitled, Clock Recovery From Random Binary Signals, Volume 11, page 541–542, October 1975, and is incorporated herein by reference.

Figure 8B:
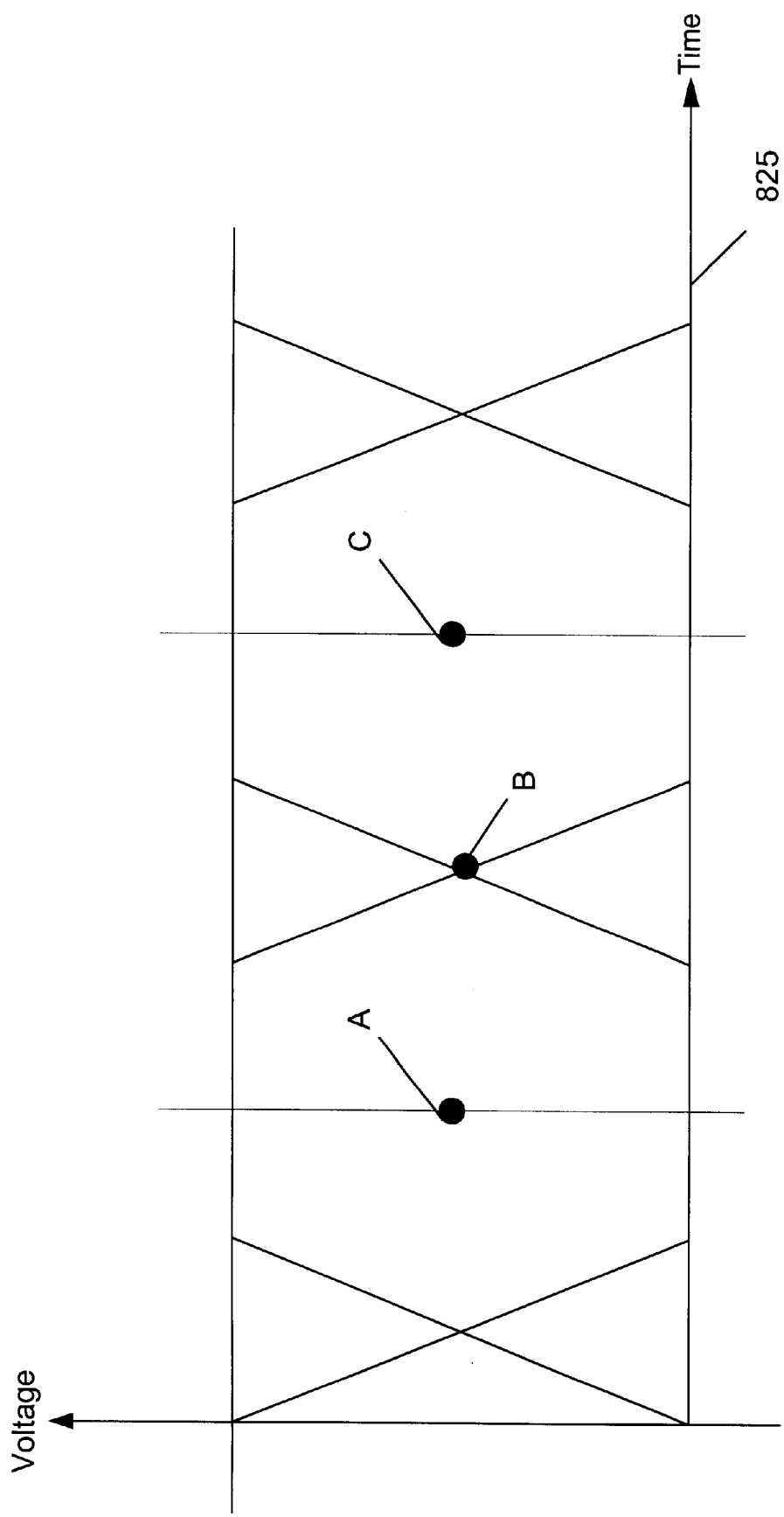
FIG. 8B is an "eye" diagram illustrating the sample times commonly used in phase detection using a "bang-bang" phase detector.

Basically an Alexander or bang-bang phase detector works as illustrated in the "eye" diagram in FIG. 8B. The I-diagram is an oscilloscope response to the digital data when the horizontal sweep rate of the oscilloscope is equals the baud rate, byte rate or clock rate. In FIG. 8B, the data waveform is sampled at 3 points: A, B and C. The sampling at A, B and C corresponds to transition times of the clock. The binary values of variables A, B and C are related to the relationship between the clock and the data by the following rules. One, if A=B and B≠C, then the clock is late. Two, if A≠B and B=C, then the clock is early. Three, if A=B=C, then no decision is possible as to the lateness or earliness of the clock with respect to the data. Four, if A=C≠B, then no decision is possible as to whether the clock is late or early with respect to the data. A variety of circuit implementations for bang-bang phase detectors are well known in the art. They, in general, correspond to the rules in an article by J. D. H. Alexander "Clock Recovery From Random Binary Signals" published in Electronic Letters, Vol. 11, p. 541 and 542, October 1975, which is incorporated by reference herein. The results of the clock sampling can be easily translated into the phase detector transfer function illustrated in FIG. 9.

Figure 9:
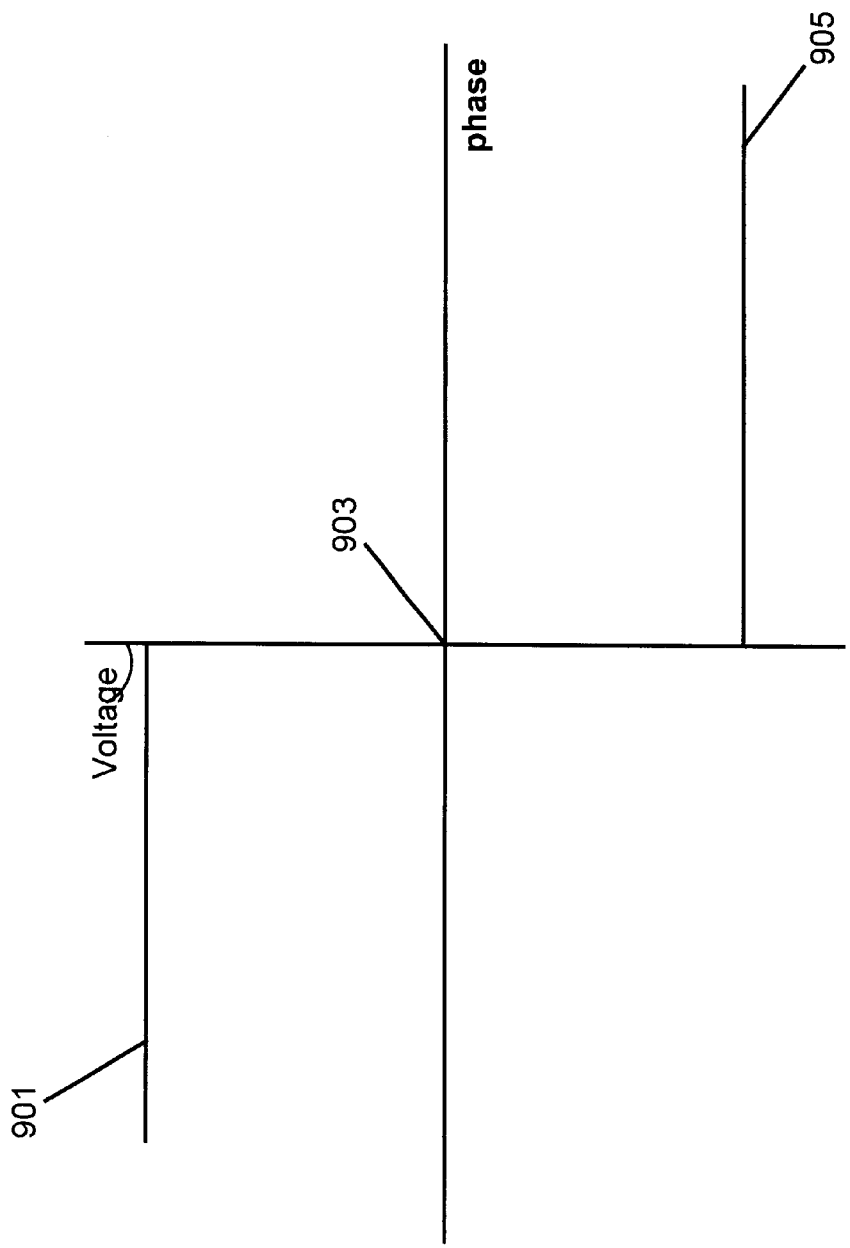
FIG. 9 is a graph of the phase versus voltage characteristic of a bang bang phase detector.

FIG. 9 is a graphical illustration of the curve of a bang-bang phase detector. A bang-bang phase detector's two outputs (i.e., 817 and 819) are commonly translated into three output states as seen in FIG. 9. The output is positive 901 when the signal coupled to the clock input is late with respect to the signal coupled into the data input. The bang-bang output is negative 905 when the clock's signal is early when compared with the data signal input, and the bang-bang output is zero 903 when no decision can be made as to whether the clock and the data are late or early with respect to each other. Other variations are possible, including detectors which merely detect if the last comparison indicated a lagging or leading phase relationship, and the indication does not change when the last indication when the phases are equal.

Figure 10A:
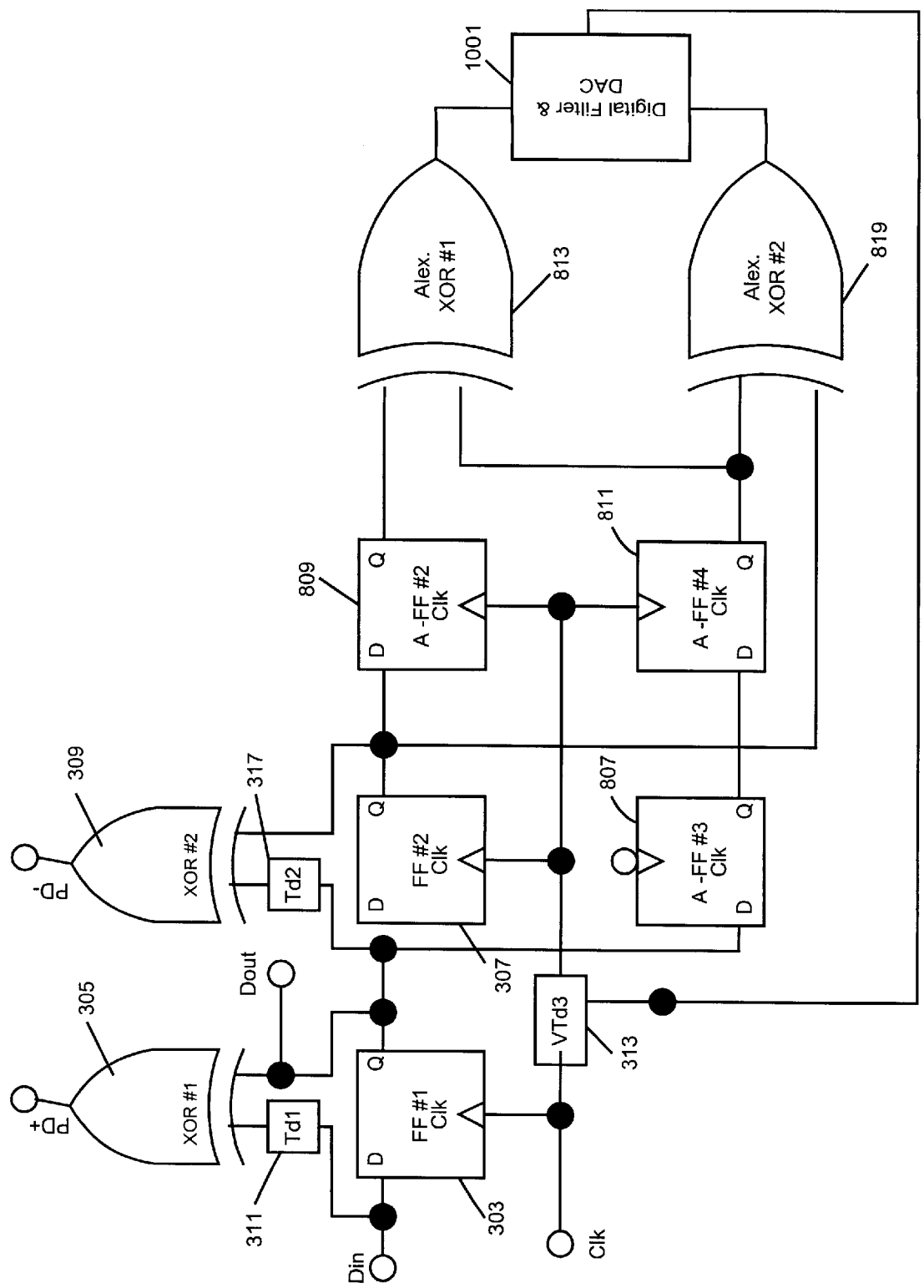
FIG. 10A is a combination block and circuit diagram of a modified Hogge phase detector into which an Alexander type phase detector has been integrated.

FIG. 10A is a combination circuit and block diagram of a modified Hogge phase detector into which an Alexander type phase detector has been integrated. In FIG. 10 the second Flip-Flop 307 of the modified Hogge phase detector circuit is shared with an Alexander type phase detector. This circuit arrangement is convenient because the second Flip-Flop 307 of the modified Hogge phase detector is the same as the first Flip-Flop of the integrated Alexander phase detector. The second Flip-Flop 307 of the modified Hogge phase detector is the circuit which controls the zero crossing point of the Hogge phase detector. The first Flip-Flop of the Alexander phase detector is the Flip-Flop used to control the zero point of the Alexander phase detector. Therefore, the same Flip-Flop controls the zero phase point of both phase detectors.

Figure 10B:
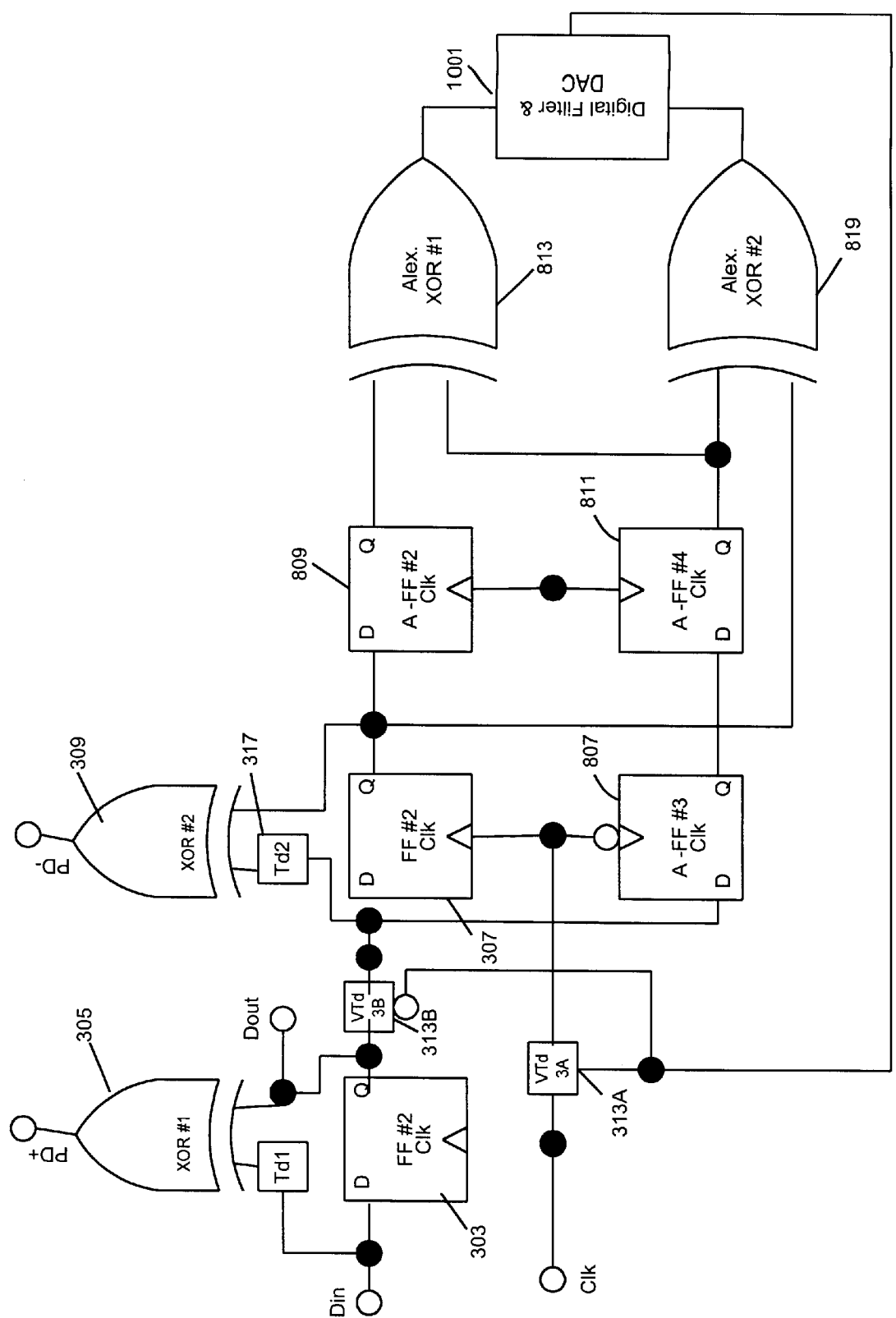
FIG. 10B is a further embodiment of a combination circuit and block diagram of a modified Hogge phase detector into which an Alexander type phase detector has been integrated.

FIG. 10B is a combination circuit and block diagram of a modified Hogge phase detector into which a Alexander phase detector has been integrated. FIG. 10B is similar to FIG. 10 except that in FIG. 10 delay 3 is a single delay while in FIG. 10B delay 3 has been split into complementary delays 313A and 313B. Delay 313A works in a complementary fashion to delay 3, that is, as the common control signal (to delays 3A and 3B) tends to increase the delay 3B; it tends to retard delay 3A.

Figure 11:
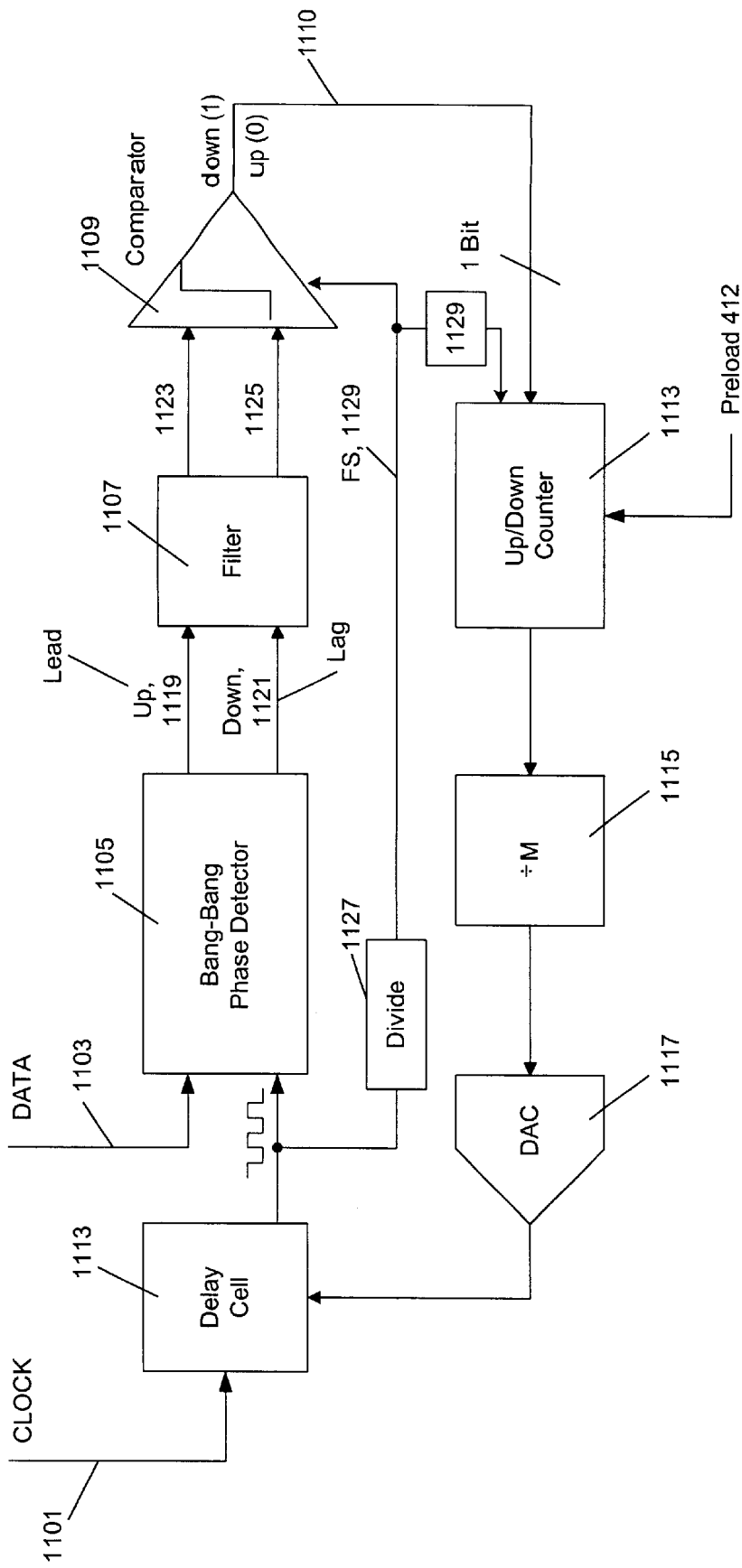
FIG. 11 is a block diagram of a closed loop control system as may be used to control variable circuit delays according to embodiments of the invention.

FIG. 11 is a block diagram of circuitry, which uses a bang-bang phase detector to control local clock delay and thereby synchronize clock signals with data signals. Circuitry, such as illustrated in FIG. 11 can be used with a variety of phase detectors to match clock and data in a variety of points within phase detector circuitry, and is not limited to the illustrative examples which follow. In FIG. 11, a clock signal 1101 is coupled into a delay cell 1113. Although the present exemplary implementation provides a delay cell, such as 1113, in line with the clock signal delays can alternately be inserted into a data line and complimentary delays can be inserted into both data and clock lines. Complimentary delays and data and clock lines can produce an increasing delay in one line and a decreasing delay in the second line in order to match the phase of the clock and data signals. The delayed clock signal emerges from the delay cell 113 and then is coupled into a bang-bang phase detector 1105. The bang-bang phase detector 1105 compares the delayed clock with data input 1103 and produces output pulses. The bang-bang phase detector produces up pulses if the clock leads the data and produces down pulses if the clock lags the data. Bang-bang phase detectors, i.e., Alexander type phase detectors, generally can tell if the clock leads the data, follows the data and some can determine if the clock phase is equal to the phase of the data. Generally, no information on how much a clock signal leads or lags a data signal is developed by a bang-bang phase detector. The up signal 1119 and the down signal 1121 from the bang-bang phase detector is coupled into a filter 1107. The filter is further illustrated in FIG. 12.

Figure 12:
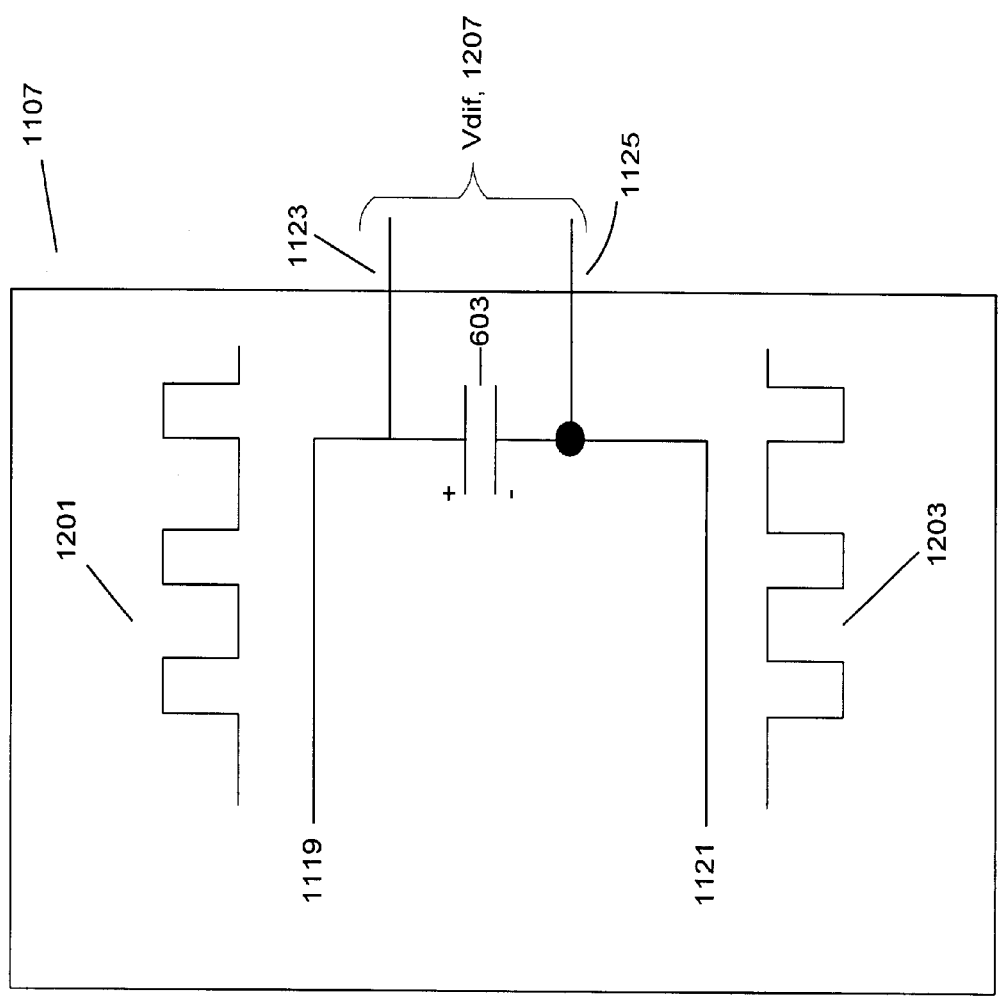
FIG. 12 is a graphical illustration of a circuit used to differentially integrate the up and down pulse outputs of a "bang-bang" phase detector.

FIG. 12 is a graphical illustration of a filter as may be used to integrate the output of a bang-bang phase detector. The exemplary filter in FIG. 12 comprises a capacitor 1205. The positive side of capacitor 1205 accepts up pulses on line 1119 from the bang-bang phase detector. The capacitor 1205 also accepts down pulses from output 1121, the down output of the bang-bang phase detector 1105. The up pulses, represented by 1201 and the down pulses represented by 1203, are coupled across the capacitor 1205 to form a differential voltage (Vdif) 1207 measured across outputs 1123 and 1125 of the filter 1107. Graph 1301 is an illustration of Vdif 1207 as it switches between positive and negative values. The outputs 1123 and 1125 from the filter 1107 are coupled into a comparator 1107. The output of the comparator 1109 is a 1 if the Vdif voltage is positive and is zero if the Vdif voltage is negative. The relationship between Vdif voltage and the output of comparator 1109 are illustrated in FIG. 13.

Figure 13:
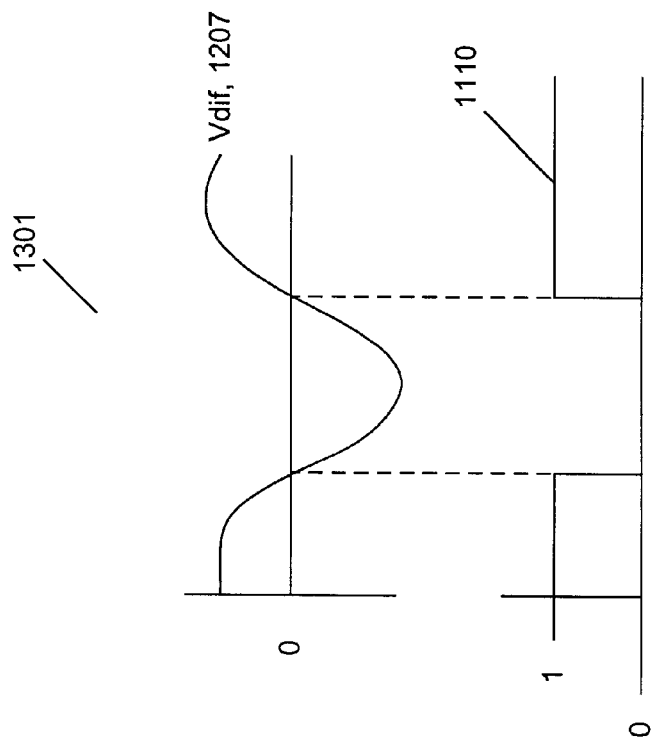
FIG. 13 is a graphical illustration relating the analog input waveform to digital output in a one bit analog to digital converter.

FIG. 13 is a graphical comparison of Vdif voltage into comparator 1109 as compared with the output 1110 of comparator 1109. When Vdif is a positive value, the output 1110 of comparator 1109 is has a value of "1" as shown in trace 1303. When Vdif is less than zero, the output of 1110 of comparator 1109 is a "0" value, also as shown in trace 1303. The Vdif signal is sampled by the comparator 1109 at times dictated by a clock signal, which is the result of dividing the delayed clock signal by divider 1127. The divided clock output from divider 1127 is also coupled into a further divider 1129 and used to clock an up/down counter 1111. The up/down counter 1111 receives the output from the comparator 1109. If the output of the comparator 1109 is a "1", then the up/down counter 1111 will count down. If the output of comparator 1109 is a "0", then the up/down counter 1111 will count up. The up/down counter also may be preloaded with an initial starting value using preload input 1114. The output of the up/down counter is then further coupled into a divide by M circuit 1115, which decimates (reduces by a factor) the input count. The divide by M circuit may sample the most significant byte of up/down counter 1111; it may also sample all of the K-bytes of up/down counter 1111 or any range in between. The output of up/down counter 1111 is then further decimated in a divide circuit 1115, where the output of the up/down counter 1111 is divided by M. The output of divider 1115 is then further coupled into a digital-to-analog converter 1117 which is then further coupled into delay cell 1113 in order to troll the amount of delay caused by delay cell 1113. Delay cell 1113 may also be controlled directly from the digital output of the divide by M circuit 1115. If the delay cell 1113 is directly controlled by the digital output of the divide by M circuit, then the digital-to-analog converter 1117 may be eliminated. Those skilled in the art will recognize that by increasing divides 1127, 1129, 1115 and by dropping less significant bytes of up/down counter 1111, the overall frequency response of the delay cell control loop can be increased or decreased.

FIG. 14 is an example of how controlling the decimation ratio of divide by circuit 1115 and of controlling the divide circuit 1129 can control the frequency response of the delay cell control loop. In the example illustrated in FIG. 14, if the decimation ratio is 1024, meaning that divide by counter 1115 divides its input by 1024, and if the up/down counter is clocked at a clock rate which is equal to the sample rate FS, 1129, divided by 1024, then the equivalent bandwidth of the delay cell control loop is 4.7 KHz. By reducing the decimation ratio from 1024 to 8 and by increasing the clock rate by dividing it by 8 instead of 1024, the equivalent bandwidth becomes 601.6 KHz as shown in FIG. 14. In one actual implementation, the decimation ratio is increased from 1024, (i.e. 1K) to 8182, (i.e. 8K) while holding the clock rate to fs/1024. An equivalent bandwidth of approximately 500 Hz results. Because the change in circuit delays primarily results from slow changing factors, such as circuit temperature, a 500 Hz delay cell control loop bandwidth can be more than adequate to sufficiently control the offsets that delay cell 1113 will need to compensate.

A configuration such as that illustrated in FIG. 11 can provide a range of benefits to electronic systems. The filter 1107 provides a first benefit. By coupling the up pulses of a bang-bang phase detector into one-side of a capacitor (e.g. 1205) and coupling the down pulses of a bang-bang phase detector into the other side of a capacitor a differential integrator results. Because the filter 1107 is a differential integrator, it will exhibit a voltage that is related to the differential in the number of pulses produced by the up 1119 and the down 1121 outputs of the bang-bang phase detector 1105. The output of the filter 1107 is then a signal which represents an average indicating whether the clock is leading the data or vice versa. The up/down counter 1111 provides a second advantage. The up/down counter 1111 can provide a convenient way to increase and decrease the bandwidth of the delay control loop. The bandwidth of the delay control loop can be increased by increasing the clock frequency of the up/down counter 1111 and be decreased by decreasing the clock frequency of the up/down counter 1111. Because the clock of the up/down counter 1111 can be increased or decreased easily by changing a divide by ratio 1129 in line with the up/down counter clock, the bandwidth of the system can be controlled dynamically. For example, when the loop is initially started, the response of the loop can be increased in order to facilitate signal acquisition and lock. Conversely, the loop can be desensitized by decreasing the frequency of the up/down counter clock, thereby lowering the bandwidth of the loop. A further advantage of the circuitry as depicted in FIG. 11 is that the up/down counter 1111 can be preloaded with a value. This value can represent the steady state value that the loop settled into the last time it was active thereby reducing the time necessary for the delay cell control loop of FIG. 11 to settle to the correct delay value. The up/down counter can also be preloaded with a number representing the offset as the pattern of the data received changes. For example, with respect to FIG. 5C, if curve 509 represents header data and curve 511 represents normal data, then during the period where the header is being received, the offset will be as shown in FIG. 5C at 515. Once the end of the header is detected, the offset will be 515 as represented by curve 511. When the end of the header data is detected, the counter can be preloaded with a number representing the offset 513 thereby facilitating settling of the loop to the correct offset.

The foregoing descriptions of exemplary embodiments of the present disclosure have been presented for the purpose of illustration and description. It is not intended to be exhaustive nor to limit the inventive concepts to the embodiments disclosed. Many modifications and variations are possible in light of the above teaching. It is intended that the scope of the invention be limited not within this detailed description, but rather by the claims appended hereto, which appear below.

What is claimed is:

1. An automatic clock positioning circuit for automatically positioning a clock pulse for a digital data stream comprising:

an input for accepting a data signal;

an input for accepting a clock signal;

a controllable phase shift circuit for accepting the clock signal and delaying the clock signal proportional to a phase detector output;

a bang-bang phase detector having a first input for accepting a derivative data signal from the data signal, having a second input for receiving a delayed version of the clock signal and producing an output having at least two states, said states being determined by the phase difference between the derivative data signal and the delayed version of the clock signal, and producing the phase detector output; and a delay circuit coupled to a low pass filter, said delay circuit comprising a variable delay responsive to the phase detector output.

2. An automatic clock positioning circuit as in claim 1, wherein the output signal of the bang-bang phase detector comprises:

an up output which produces a pulse when the data signal leads the clock signal in phase; and a down output which produces a pulse when the data signal lags the clock signal in phase.

3. An automatic clock positioning circuit as in claim 1, wherein the output states of the bang-bang phase detector further comprise:

a first state indicating that the clock signal is leading the data signal; and a second state indicating that the clock signal is lagging the data signal, wherein the 'output state of the automatic clock positioning circuit does not change if the clock signal is leading the data signal.

4. An automatic clock positioning circuit as in claim 1 wherein the phase detector output comprises:

a first state indicating that the clock signal is leading the data signal;

a second state indicating that the clock signal is leading the data signal: and a third state indicating that the clock signal is equal to the data signal.

* * * * *